United States Patent
Xiao et al.

(10) Patent No.: US 9,034,519 B2
(45) Date of Patent: May 19, 2015

(54) ULTRATHIN SURFACE COATING ON NEGATIVE ELECTRODES TO PREVENT TRANSITION METAL DEPOSITION AND METHODS FOR MAKING AND USE THEREOF

(71) Applicant: GM Global Technology Operations LLC, Detroit, MI (US)

(72) Inventors: Xingcheng Xiao, Troy, MI (US); Junghyun Kim, Troy, MI (US); Zhongyi Liu, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 13/745,039

(22) Filed: Jan. 18, 2013

(65) Prior Publication Data
US 2014/0205905 A1 Jul. 24, 2014

(51) Int. Cl.
| | |
|---|---|
| *H01M 4/134* | (2010.01) |
| *H01M 4/1391* | (2010.01) |
| *H01M 4/13* | (2010.01) |
| *H01M 4/04* | (2006.01) |
| *H01M 4/133* | (2010.01) |
| *H01M 4/36* | (2006.01) |
| *H01M 4/62* | (2006.01) |
| *C23C 16/30* | (2006.01) |
| *C23C 16/40* | (2006.01) |

(Continued)

(52) U.S. Cl.
CPC .............. *H01M 4/049* (2013.01); *H01M 4/133* (2013.01); *H01M 4/134* (2013.01); *H01M 4/366* (2013.01); *H01M 4/505* (2013.01); *H01M 4/525* (2013.01); *H01M 4/62* (2013.01); *C23C 16/303* (2013.01); *C23C 16/403* (2013.01); *Y02E 60/122* (2013.01)

(58) Field of Classification Search
None
See application file for complete search history.

(56) References Cited

U.S. PATENT DOCUMENTS

| | | |
|---|---|---|
| 6,451,487 B1 | 9/2002 | Besner et al. |
| 7,018,607 B2 | 3/2006 | Nazri et al. |

(Continued)

FOREIGN PATENT DOCUMENTS

| | | |
|---|---|---|
| CN | 103779550 A | 5/2014 |
| CN | 103943819 A | 7/2014 |

(Continued)

OTHER PUBLICATIONS

Aurbach, Doron, et al., "Design of electrolyte solutions for Li and Li-ion batteries: a review," Electrochimica Acta, vol. 50, pp. 247-254 (2004) (published online Aug. 3, 2004).

(Continued)

*Primary Examiner* — Cynthia K Walls
(74) *Attorney, Agent, or Firm* — Harness, Dickey & Pierce, P.L.C.

(57) ABSTRACT

An electrode material for use in an electrochemical cell, like a lithium-ion battery, is provided. The electrode material may be a negative electrode comprising graphite, silicon, silicon-alloys, or tin-alloys, for example. By avoiding deposition of transition metals, the battery substantially avoids charge capacity fade during operation. The surface coating is particularly useful with negative electrodes to minimize or prevent deposition of transition metals thereon in the electrochemical cell. The coating has a thickness of less than or equal to about 40 nm. Methods for making such materials and using such coatings to minimize transition metal deposition in electrochemical cells are likewise provided.

15 Claims, 6 Drawing Sheets

(51) Int. Cl.
*H01M 4/505* (2010.01)
*H01M 4/525* (2010.01)

(56) References Cited

U.S. PATENT DOCUMENTS

| | | |
|---|---|---|
| 7,285,260 B2 | 10/2007 | Armand et al. |
| 7,457,018 B2 | 11/2008 | Armand et al. |
| 7,491,467 B2 * | 2/2009 | Satoh et al. .......... 429/217 |
| 7,651,732 B2 | 1/2010 | Cheng et al. |
| 7,722,994 B2 | 5/2010 | Halalay |
| 7,736,805 B2 | 6/2010 | Nazri et al. |
| 8,101,152 B1 | 1/2012 | Halalay et al. |
| 8,148,455 B2 | 4/2012 | Posudievsky et al. |
| 8,247,116 B2 | 8/2012 | He et al. |
| 8,309,644 B1 | 11/2012 | Huang |
| 8,455,140 B1 | 6/2013 | Huang et al. |
| 8,460,591 B2 | 6/2013 | Huang et al. |
| 8,460,829 B1 | 6/2013 | Huang et al. |
| 8,470,468 B2 | 6/2013 | Xiao et al. |
| 8,470,898 B2 | 6/2013 | Huang |
| 2007/0238023 A1 | 10/2007 | Gorshkov et al. |
| 2008/0226987 A1 | 9/2008 | Yumoto et al. |
| 2008/0261116 A1 | 10/2008 | Burton et al. |
| 2009/0136415 A1 | 5/2009 | Gorshkov et al. |
| 2009/0140742 A1 | 6/2009 | Koch et al. |
| 2009/0253042 A1 | 10/2009 | Sun et al. |
| 2009/0325071 A1 | 12/2009 | Verbrugge et al. |
| 2010/0079145 A1 | 4/2010 | Meisner et al. |
| 2010/0143790 A1 | 6/2010 | Inagaki et al. |
| 2010/0272612 A1 | 10/2010 | Ramamurthy |
| 2011/0017528 A1 | 1/2011 | Kumar et al. |
| 2011/0044886 A1 | 2/2011 | Gorshkov et al. |
| 2011/0086249 A1 | 4/2011 | Timmons |
| 2011/0086294 A1 | 4/2011 | Xiao et al. |
| 2011/0111308 A1 | 5/2011 | Halalay et al. |
| 2011/0121225 A1 | 5/2011 | Posudievsky et al. |
| 2011/0151333 A1 | 6/2011 | Halalay et al. |
| 2011/0165459 A1 | 7/2011 | Halalay et al. |
| 2011/0166811 A1 | 7/2011 | Koch et al. |
| 2011/0189577 A1 | 8/2011 | Chung et al. |
| 2011/0200781 A1 | 8/2011 | Sowul et al. |
| 2011/0200863 A1 | 8/2011 | Xiao et al. |
| 2011/0224928 A1 | 9/2011 | Lin et al. |
| 2011/0250478 A1 | 10/2011 | Timmons et al. |
| 2012/0086457 A1 | 4/2012 | Meisner et al. |
| 2012/0100403 A1 | 4/2012 | Wang et al. |
| 2012/0101674 A1 | 4/2012 | Wang et al. |
| 2012/0105068 A1 | 5/2012 | Wang et al. |
| 2012/0105069 A1 | 5/2012 | Wang et al. |
| 2012/0109503 A1 | 5/2012 | Yang et al. |
| 2012/0156568 A1 | 6/2012 | Kia et al. |
| 2012/0156569 A1 | 6/2012 | Kia et al. |
| 2012/0161757 A1 | 6/2012 | Koch et al. |
| 2012/0161776 A1 | 6/2012 | Koch et al. |
| 2012/0169297 A1 | 7/2012 | Schaefer et al. |
| 2012/0208087 A1 | 8/2012 | Yamamoto et al. |
| 2012/0219852 A1 | 8/2012 | Huang et al. |
| 2012/0227252 A1 | 9/2012 | Nazri |
| 2012/0229096 A1 | 9/2012 | Nazri |
| 2012/0231321 A1 | 9/2012 | Huang et al. |
| 2012/0244390 A1 | 9/2012 | Cheng et al. |
| 2012/0244418 A1 | 9/2012 | Cheng et al. |
| 2012/0264017 A1 | 10/2012 | Nazri et al. |
| 2012/0301790 A1 | 11/2012 | Xiao et al. |
| 2012/0308853 A1 | 12/2012 | Vanimisetti et al. |
| 2012/0308872 A1 | 12/2012 | Huang |
| 2012/0328927 A1 | 12/2012 | Timmons et al. |
| 2013/0071736 A1 | 3/2013 | Xiao et al. |
| 2013/0071742 A1 | 3/2013 | Halalay et al. |
| 2013/0099159 A1 | 4/2013 | Halalay et al. |
| 2013/0122374 A1 | 5/2013 | Verbrugge et al. |
| 2013/0131200 A1 | 5/2013 | Huang |
| 2013/0157125 A1 | 6/2013 | Sachdev et al. |
| 2013/0175998 A1 | 7/2013 | Wang et al. |
| 2013/0177804 A1 | 7/2013 | Verbrugge et al. |
| 2013/0177808 A1 | 7/2013 | Wang et al. |
| 2013/0183582 A1 | 7/2013 | Halalay et al. |
| 2013/0189576 A1 | 7/2013 | Verbrugge et al. |
| 2013/0224602 A1 | 8/2013 | Huang |
| 2013/0234674 A1 | 9/2013 | Nazri |
| 2013/0284338 A1 | 10/2013 | Xiao et al. |
| 2013/0319599 A1 | 12/2013 | Huang |
| 2013/0323595 A1 | 12/2013 | Sohn et al. |
| 2014/0023931 A1 | 1/2014 | Huang |
| 2014/0038024 A1 | 2/2014 | Huang |
| 2014/0113197 A1 | 4/2014 | Xiao et al. |

FOREIGN PATENT DOCUMENTS

| | | |
|---|---|---|
| DE | 102013220351 A1 | 4/2014 |
| WO | 2014/022986 A1 | 2/2014 |

OTHER PUBLICATIONS

Bai, Ying, et al., "Microstructure and electrochemical performances of LiF-coated spinel LiMn2O4," Transactions of Nonferrous Metals Society of China, vol. 17, pp. s892-s896 (2007).

Gaines, Linda, et al., "Costs of Lithium-Ion Batteries for Vehicles," Argonne National Laboratory, Center for Transportation Research (May 2000).

George, Steven M., "Atomic Layer Deposition: An Overview," Chem. Rev., vol. 110, No. 1, pp. 111-131 (2010) (published online Nov. 30, 2009).

Goldstein, David N., et al., "Al12O3 Atomic Layer Deposition with Trimethylaluminum and Ozone Studied by in Situ Transmission FTIR Spectroscopy and Quadrupole Mass Spectrometry," J. Phys. Chem. C, vol. 112, No. 49, pp. 19530-19539 (2008) (published online Nov. 13, 2008).

Lee, Won-Jun, et al., "A Comparative Study on the Si Precursors for the Atomic Layer Deposition of Silicon Nitride Thin Films," Journal of the Korean Physical Society, vol. 45, No. 5, pp. 1352-1355 (Nov. 2004).

Leskela, Markku, et al., "Atomic layer deposition (ALD): from precursors to thin film structures," Thin Solid Films, vol. 409, pp. 138-146 (2002).

Nikkei Electronics, "New Anode Material Could Boost Lithium Battery Performance by 30 Percent," available at http://www.greentechmedia.com/articles/read/new-anode-material-could-boost-lithium-battery-performance-by-30-percent (Nov. 2, 2010) (2 pages).

Qin, Yan, et al., "Mechanism of LTO Gassing and potential solutions," Argonne National Laboratory Presentation, May 9-13, 2011 (18 pages).

Ramadass, Premanand, et al., "Mathematical Modeling of SEI Formation in Li-Ion Cell Anodes," 202nd Meeting of The Electrochemical Society—Salt Lake City, UT, Oct. 20-25, 2002, (Abstract) (10 pages) (Oct. 23, 2002).

Vetter, J., et al., "Ageing mechanisms in lithium-ion batteries," J. Power Sources, vol. 147, Nos. 1-2, pp. 269-281 (Sep. 9, 2005).

Franssila, Sami, Introduction to Microfabrication, Second Ed., p. 53 (2010).

Huntsman Corporation, JEFFAMINE® ED-2003 Polyetheramine Technical Bulletin, Form 5197-0208 (2007) (2 pages).

* cited by examiner

ULTRATHIN SURFACE COATING ON NEGATIVE ELECTRODES TO PREVENT TRANSITION METAL DEPOSITION AND METHODS FOR MAKING AND USE THEREOF

FIELD

The present disclosure relates to ultrathin surface coatings for electrodes for use in electrochemical devices to prevent transition metal deposition and capacity fade, such as aluminum oxide-based coatings on negative electrode materials, methods for making such coatings, and methods for use thereof.

BACKGROUND

This section provides background information related to the present disclosure which is not necessarily prior art.

High-energy density, electrochemical cells, such as lithium-ion batteries can be used in a variety of consumer products and vehicles. Typical lithium-ion batteries comprise a first electrode (e.g., a cathode), a second electrode (e.g., an anode), an electrolyte material, and a separator. Often a stack of lithium-ion battery cells are electrically connected to increase overall output. Conventional lithium-ion batteries operate by reversibly passing lithium ions between the negative electrode and the positive electrode. A separator and an electrolyte are disposed between the negative and positive electrodes. The electrolyte is suitable for conducting lithium ions and may be in solid or liquid form. Lithium ions move from a cathode (positive electrode) to an anode (negative electrode) during charging of the battery, and in the opposite direction when discharging the battery. Each of the negative and positive electrodes within a stack is connected to a current collector (typically a metal, such as copper for the anode and aluminum for the cathode). During battery usage, the current collectors associated with the two electrodes are connected by an external circuit that allows current generated by electrons to pass between the electrodes to compensate for transport of lithium ions.

Many different materials may be used to create these components for a lithium-ion battery. By way of non-limiting example, cathode materials for lithium batteries typically comprise an electroactive material which can be intercalated with lithium ions, such as lithium-transition metal oxides or mixed oxides of the spinel type, for example including spinel $LiMn_2O_4$, $LiCoO_2$, $LiNiO_2$, $LiMn_{1.5}Ni_{0.5}O_4$, $LiNi_{(1-x-y)}Co_xM_yO_2$ (where $0<x<1$, $y<1$, and M may be Al, Mn, or the like), or lithium iron phosphates. The electrolyte typically contains one or more lithium salts, which may be dissolved and ionized in a non-aqueous solvent. The negative electrode typically includes a lithium insertion material or an alloy host material. Typical electroactive materials for forming an anode include lithium-graphite intercalation compounds, lithium-silicon intercalation compounds, lithium-tin intercalation compounds, lithium alloys and lithium titanate $Li_{4+x}Ti_5O_{12}$, where $0 \leq x \leq 3$, such as $Li_4Ti_5O_{12}$ (LTO), which may be a nano-structured LTO. Contact of the anode and cathode materials with the electrolyte can create an electrical potential between the electrodes. When electron current is generated in an external circuit between the electrodes, the potential is sustained by electrochemical reactions within the cells of the battery.

Lithium transition metal based oxides, especially lithium manganese-based oxides like spinel $LiMn_2O_4$, $LiMn_{0.33}Ni_{0.33}Co_{0.33}O_2$, $LiMn_{1.5}Ni_{0.5}O_4$, and other Li-rich materials, are promising active cathode materials for lithium-ion batteries as power sources, especially in Hybrid Electric Vehicles (HEVs) and Electric Vehicles (EVs). These materials have been extensively studied as positive electrode materials because of their lower costs, high rate capability, and higher thermal stability as compared with traditional $LiCoO_2$. However, there remain certain outstanding challenges to using these materials in lithium-ion batteries, especially in electric vehicles. One issue is capacity fade, especially when the positive electrode comprises manganese-containing materials.

Thus, while lithium manganese-based materials and other lithium transition metal oxides are promising active materials for high power lithium-ion batteries, the current shortcomings prevent their widespread commercial use, especially in vehicle applications. For long term and effective use, it would be desirable to improve electrochemical cells that employ such active materials to avoid or minimize capacity fade and loss, while employing the desirable aspects of these active materials that provide durable, long-lifetime lithium-ion batteries having lower costs, high rate capability, high current efficiency, and higher thermal stability.

SUMMARY

This section provides a general summary of the disclosure, and is not a comprehensive disclosure of its full scope or all of its features.

In certain aspects, the present disclosure provides an electrode material for an electrochemical cell. The electrode material has a surface coating formed on one or more surface regions of the electrode material. In certain aspects, the electrode material may be a negative electrode electroactive material selected from the group consisting of: graphite, silicon, silicon-containing alloys, tin-containing alloys, and combinations thereof. In certain variations, the electrode material comprises graphite. The surface coating may have a thickness of less than or equal to about 40 nm. In certain variations, the surface coating is an oxide-based surface coating, such as aluminum oxide. In other variations, the surface coating may be a fluoride-based surface coating or a nitride-based surface coating. The surface coating minimizes or prevents deposition of transition metals present within the electrochemical cell onto the surface of the graphite or other negative electrode material, which may beneficially avoid charge capacity fade to substantially maintain the charge capacity of the electrochemical cell.

In other aspects, the present disclosure provides a lithium-ion electrochemical cell comprising a negative electrode having a surface coating formed on one or more surface regions. The surface coating has a thickness of less than or equal to about 40 nm. In certain aspects, the electrode material may be a negative electrode electroactive material selected from the group consisting of: graphite, silicon, silicon-containing alloys, tin-containing alloys, and combinations thereof. In certain variations, the negative electroactive material comprises graphite. In certain embodiments, the surface coating is an oxide-based surface coating, such as aluminum oxide. In other variations, the surface coating may be a fluoride-based surface coating or a nitride-based surface coating. The electrochemical cell also has a positive electrode comprising a positive electroactive material comprising a transition metal, as well as a separator and an electrolyte. In certain variations, the transition metal is selected from the group consisting of: manganese, nickel, cobalt, and combinations thereof. In certain other variations, the transition metal is manganese. In various aspects, the surface coating minimizes or prevents deposition of the transition metal on the negative electrode. In certain aspects, minimizing or preventing deposition of the transition metal substantially maintains charge capacity of the lithium-ion electrochemical cell for greater than or equal to about 500 hours of operation.

In yet other aspects, the present disclosure provides a method of making an electrode for an electrochemical cell. The method comprises applying a surface coating to an electrode material via a deposition process. In certain variations, the electrode material is a negative electrode material comprising graphite, or alternatively may comprise silicon, tin, or other such negative electrode materials. In certain variations, the surface coating is an oxide-based surface coating. In other variations, the surface coating may be a fluoride-based surface coating or a nitride-based surface coating. The surface coating formed by the applying process has a thickness of less than or equal to about 40 nm.

In further aspects, the present disclosure also provides a method of minimizing or preventing deposition of transition metals on electrodes for a lithium-ion battery. In certain variations, the electrode is a negative electrode in a lithium-ion battery. The negative electrode may be formed of a material comprising graphite, silicon, tin, or other negative electrode materials. In certain variations, the negative electrode is formed of a material comprising graphite. The method comprises applying a surface coating to a negative electrode material. In certain aspects, the surface coating is selected from the group consisting of: an oxide-based surface coating, a fluoride-based surface coating, and a nitride-based surface coating. The lithium-ion battery further comprises a positive electrode comprising an electroactive material comprising a transition metal, a separator, and an electrolyte. In certain variations, the transition metal is selected from the group consisting of: manganese, nickel, cobalt, and combinations thereof. In certain other variations, the transition metal comprises manganese. The surface coating minimizes or prevents deposition of the transition metal onto the electrode material to substantially maintain charge capacity during charging and discharging of the lithium-ion battery for greater than or equal to about 1,000 cycles.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figures 8, 9:
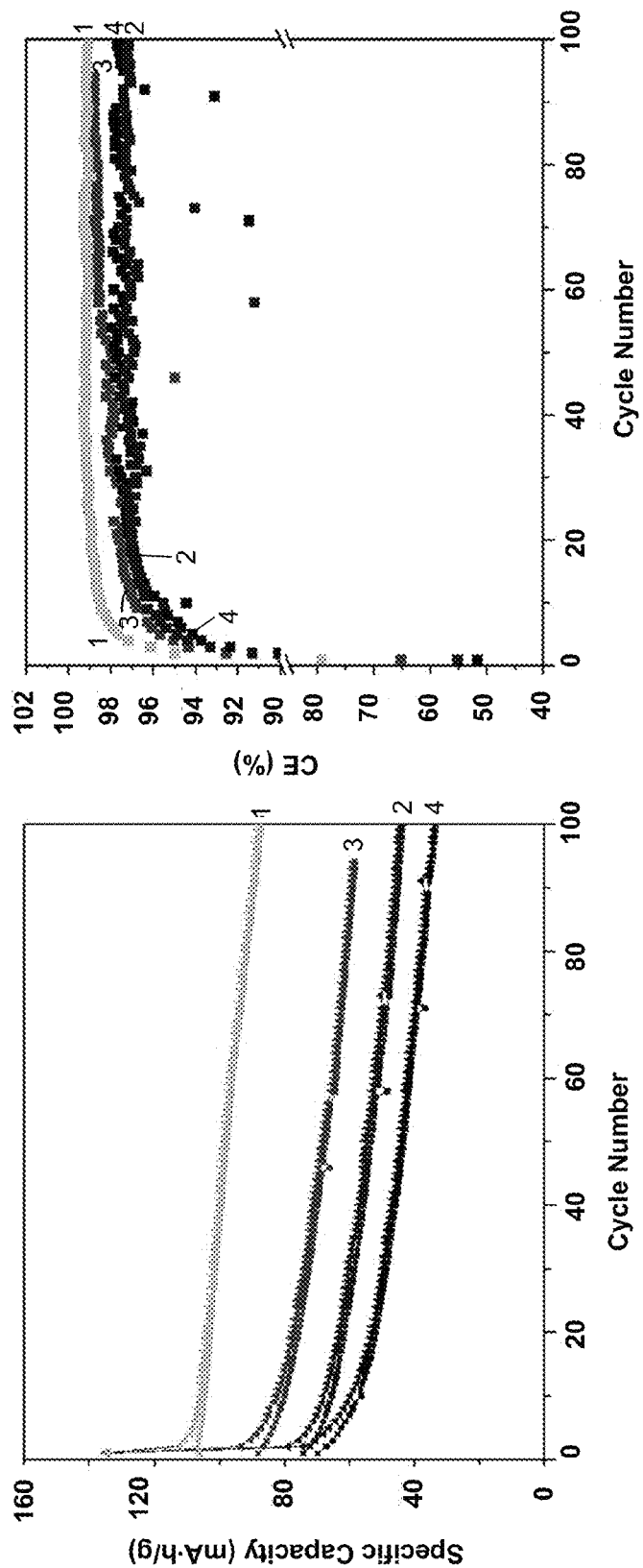

FIG. 8 shows specific capacity (mA·h/g) over 100 discharge cycles for four full cell comparative examples 1-4, each including an electroactive positive electrode material comprising manganese (spinel, $LiMn_2O_4$). Examples 1 and 3 have a coated negative electrode at 5 nm and 0.5 nm, respectively, while example 2 has a coated positive electrode in accordance with certain variations of the present disclosure. Positive and negative electrodes in example 4 are uncoated and representative of conventional designs; and FIG. 9 shows conversion efficiency (%) over 100 discharge cycles for the four comparative examples 1-4 in FIG. 8.

DETAILED DESCRIPTION

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. In addition, disclosure of ranges includes disclosure of all values and further divided ranges within the entire range, including endpoints given for the ranges.

As used herein, the terms "composition" and "material" are used interchangeably to refer broadly to a substance containing at least the preferred chemical compound, but which may also comprise additional substances or compounds, including impurities.

Figure 1:
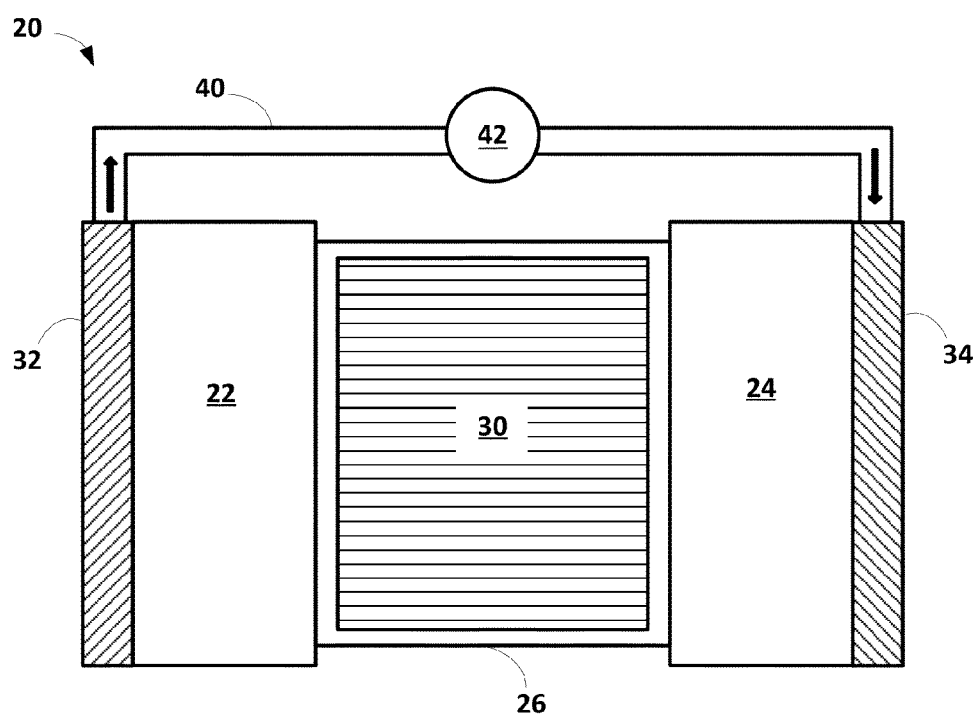
FIG. 1 is a schematic of an exemplary electrochemical battery cell.

The present technology pertains to improved electrochemical cells, especially lithium-ion batteries, which may be used in vehicle applications. An exemplary and schematic illustration of a lithium-ion battery 20 is shown in FIG. 1. Lithium-ion battery 20 includes a negative electrode 22, a positive electrode 24, and a separator 30 (e.g., a microporous polymeric separator) disposed between the two electrodes 22, 24. The separator 26 comprises an electrolyte 30, which may also be present in the negative electrode 22 and positive electrode 24. A negative electrode current collector 32 may be positioned at or near the negative electrode 22 and a positive electrode current collector 34 may be positioned at or near the positive electrode 24. The negative electrode current collector 32 and positive electrode current collector 34 respectively collect and move free electrons to and from an external circuit 40. An interruptible external circuit 40 and load 42 connects the negative electrode 22 (through its current collector 32) and the positive electrode 24 (through its current collector 34). Each of the negative electrode 22, the positive electrode 24, and the separator 26 may further comprise the electrolyte 30 capable of conducting lithium ions. The separator 26 operates as both an electrical insulator and a mechanical support, by being sandwiched between the negative electrode 22 and the positive electrode 24 to prevent physical contact and thus, the occurrence of a short circuit. The separator 26, in addition to providing a physical barrier between the two electrodes 22, 24, can provide a minimal resistance path for internal passage of lithium ions (and related anions) for facilitating functioning of the lithium-ion battery 20.

The lithium-ion battery 20 can generate an electric current during discharge by way of reversible electrochemical reactions that occur when the external circuit 40 is closed (to connect the negative electrode 22 and the positive electrode 34) when the negative electrode 22 contains a relatively greater quantity of intercalated lithium. The chemical potential difference between the positive electrode 24 and the negative electrode 22 drives electrons produced by the oxidation of intercalated lithium at the negative electrode 22 through the external circuit 40 toward the positive electrode 24. Lithium ions, which are also produced at the negative electrode, are concurrently transferred through the electrolyte 30 and separator 26 towards the positive electrode 24. The electrons flow through the external circuit 40 and the lithium ions migrate across the separator 26 in the electrolyte 30 to form intercalated lithium at the positive electrode 24. The electric current passing through the external circuit 18 can be harnessed and directed through the load device 42 until the intercalated lithium in the negative electrode 22 is depleted and the capacity of the lithium-ion battery 20 is diminished.

The lithium-ion battery 20 can be charged or re-powered at any time by connecting an external power source to the lithium-ion battery 20 to reverse the electrochemical reactions that occur during battery discharge. The connection of an external power source to the lithium-ion battery 20 compels the otherwise non-spontaneous oxidation of intercalated lithium at the positive electrode 24 to produce electrons and lithium ions. The electrons, which flow back towards the negative electrode 22 through the external circuit 40, and the lithium ions, which are carried by the electrolyte 30 across the separator 26 back towards the negative electrode 22, reunite at the negative electrode 22 and replenish it with intercalated lithium for consumption during the next battery discharge cycle. The external power source that may be used to charge the lithium-ion battery 20 may vary depending on the size, construction, and particular end-use of the lithium-ion battery 20. Some notable and exemplary external power sources include, but are not limited to, an AC wall outlet and a motor vehicle alternator. In many lithium-ion battery configurations, each of the negative current collector 32, negative electrode 22, the separator 26, positive electrode 24, and positive current collector 34 are prepared as relatively thin layers (for example, several microns or a millimeter or less in thickness) and assembled in layers connected in electrical parallel arrangement to provide a suitable energy package.

Furthermore, the lithium-ion battery 20 can include a variety of other components that while not depicted here are nonetheless known to those of skill in the art. For instance, the lithium-ion battery 20 may include a casing, gaskets, terminal caps, and any other conventional components or materials that may be situated within the battery 20, including between or around the negative electrode 22, the positive electrode 24, and/or the separator 26, by way of non-limiting example. As noted above, the size and shape of the lithium-ion battery 20 may vary depending on the particular application for which it is designed. Battery-powered vehicles and hand-held consumer electronic devices, for example, are two examples where the lithium-ion battery 20 would most likely be designed to different size, capacity, and power-output specifications. The lithium-ion battery 20 may also be connected in series or parallel with other similar lithium-ion cells or batteries to produce a greater voltage output and power density if it is required by the load device 42.

Accordingly, the lithium-ion battery 20 can generate electric current to a load device 42 that can be operatively connected to the external circuit 40. The load device 42 may be powered fully or partially by the electric current passing through the external circuit 40 when the lithium-ion battery 20 is discharging. While the load device 42 may be any number of known electrically-powered devices, a few specific examples of power-consuming load devices include an electric motor for a hybrid vehicle or an all-electrical vehicle, a laptop computer, a tablet computer, a cellular phone, and cordless power tools or appliances, by way of non-limiting example. The load device 42 may also be a power-generating apparatus that charges the lithium-ion battery 20 for purposes of storing energy.

Any appropriate electrolyte 30, whether in solid form or solution, capable of conducting lithium ions between the negative electrode 22 and the positive electrode 24 may be used in the lithium-ion battery 20. In certain aspects, the electrolyte solution may be a non-aqueous liquid electrolyte solution that includes a lithium salt dissolved in an organic solvent or a mixture of organic solvents. Numerous conventional non-aqueous liquid electrolyte 30 solutions may be employed in the lithium-ion battery 20. A non-limiting list of lithium salts that may be dissolved in an organic solvent to form the non-aqueous liquid electrolyte solution include $LiPF_6$, $LiClO_4$, $LiAlCl_4$, $LiI$, $LiBr$, $LiSCN$, $LiBF_4$, $LiB(C_6H_5)_4$, $LiAsF_6$, $LiCF_3SO_3$, $LiN(CF_3SO_2)_2$, and combinations thereof. These and other similar lithium salts may be dissolved in a variety of organic solvents, including but not limited to various alkyl carbonates, such as cyclic carbonates (ethylene carbonate (EC), propylene carbonate (PC), butylene carbonate (BC)), acyclic carbonates (dimethyl carbonate (DMC), diethyl carbonate (DEC), ethylmethylcarbonate (EMC)), aliphatic carboxylic esters (methyl formate, methyl acetate, methyl propionate), γ-lactones (γ-butyrolactone, γ-valerolactone), chain structure ethers (1,2-dimethoxyethane, 1-2-diethoxyethane, ethoxymethoxyethane), cyclic ethers (tetrahydrofuran, 2-methyltetrahydrofuran), and mixtures thereof.

The separator 30 may comprise, in one embodiment, a microporous polymeric separator comprising a polyolefin. The polyolefin may be a homopolymer (derived from a single monomer constituent) or a heteropolymer (derived from more than one monomer constituent), which may be either linear or branched. If a heteropolymer is derived from two monomer constituents, the polyolefin may assume any copolymer chain arrangement, including those of a block copolymer or a random copolymer. Similarly, if the polyolefin is a heteropolymer derived from more than two monomer constituents, it may likewise be a block copolymer or a random copolymer. In certain aspects, the polyolefin may be polyethylene (PE), polypropylene (PP), or a blend of PE and PP.

When the separator 30 is a microporous polymeric separator, it may be a single layer or a multi-layer laminate, which may be fabricated from either a dry or wet process. For example, in one embodiment, a single layer of the polyolefin may form the entire microporous polymer separator 30. In other aspects, the separator 30 may be a fibrous membrane having an abundance of pores extending between the opposing surfaces and may have a thickness of less than a millimeter, for example. As another example, however, multiple discrete layers of similar or dissimilar polyolefins may be assembled to form the microporous polymer separator 30. The microporous polymer separator 30 may also comprise other polymers in addition to the polyolefin such as, but not limited to, polyethylene terephthalate (PET), polyvinylidene fluoride (PVDF), and/or a polyamide. The polyolefin layer, and any other optional polymer layers, may further be included in the microporous polymer separator 30 as a fibrous layer to help provide the microporous polymer separator 30 with appropriate structural and porosity characteristics. Various conventionally available polymers and commercial products for forming the separator 30 are contemplated, as well as the many manufacturing methods that may be employed to produce such a microporous polymer separator 30.

The positive electrode 24 may be formed from a lithium-based active material that can sufficiently undergo lithium intercalation and deintercalation while functioning as the positive terminal of the lithium-ion battery 20. The positive electrode 24 may include a polymeric binder material to structurally fortify the lithium-based active material. One exemplary common class of known materials that can be used to form the positive electrode 24 is layered lithium transitional metal oxides. For example, in certain embodiments, the positive electrode 24 may comprise at least one spinel comprising a transition metal like lithium manganese oxide ($Li_{(1+x)}Mn_{(2-x)}O_4$), where $0 \le x \le 1$, where x is typically less than 0.15, including $LiMn_2O_4$, lithium manganese nickel oxide ($LiMn_{(2-x)}Ni_xO_4$), where $0 \le x \le 1$ (e.g., $LiMn_{1.5}Ni_{0.5}O_4$), lithium cobalt oxide ($LiCoO_2$), lithium manganese oxide ($LiMn_2O_4$), lithium nickel oxide ($LiNiO_2$), a lithium nickel manganese cobalt oxide ($Li(Ni_xMn_yCo_z)O_2$), where $0 \le x \le 1$, $0 \le y \le 1$, $0 \le z \le 1$, and $x+y+z=1$, including $LiMn_{0.33}Ni_{0.33}Co_{0.33}O_2$, a lithium nickel cobalt metal oxide ($LiNi_{(1-x-y)}Co_xM_yO_2$), where $0 \le x \le 1$, $y<1$, and M may be Al, Mn, or the like, other known lithium-transition metal oxides or mixed oxides lithium iron phosphates, or a lithium iron polyanion oxide such as lithium iron phosphate ($LiFePO_4$) or lithium iron fluorophosphate ($Li_2FePO_4F$).

Thus, in certain variations, the positive electrode 24 may comprise a spinel as an electroactive material, such as lithium manganese oxide ($Li_{(1+x)}Mn_{(2-x)}O_4$) or lithium manganese nickel oxide ($LiMn_{(2-x)}Ni_xO_4$), where $0 \le x \le 1$, or lithium manganese nickel cobalt oxide (e.g., $LiMn_{1/3}Ni_{1/3}Co_{1/3}O_2$). Such active materials may be intermingled with at least one polymeric binder, for example, by slurry casting active materials with such binders, like polyvinylidene fluoride (PVDF), ethylene propylene diene monomer (EPDM) rubber, or carboxymethoxyl cellulose (CMC). The positive current collector 34 may be formed from aluminum or any other appropriate electrically conductive material known to those of skill in the art.

Lithium transition metal based oxides, especially lithium manganese-based oxides, have been explored for use as positive electrode active materials because of their lower costs, high rate capability, and higher thermal stability, as compared with traditional cathode active materials, like $LiCoO_2$. Certain outstanding challenges to using these conventional lithium manganese oxide based materials as lithium-ion batteries remain, especially in electric vehicles. One issue is capacity fade, which may be attributable to transition metal dissolution and deposition. For example, manganese (Mn) dissolution in a lithium-ion battery using a lithium-ion manganese oxide cathode active material has been observed and is believed to be due to the disproportionation reaction ($2Mn^{3+} \rightarrow Mn^{4+} + Mn^{2+}$) at the particle surface, which can result in the formation of a defect spinel. The capacity loss related to Mn dissolution may be generally attributed to two processes. The first is that $Mn^{2+}$ can be irreversibly dissolved from the positive electrode into the electrolyte (especially in the presence of hydrofluoric acid (HF)), leading to a potentially permanent loss of positive electrode materials and a decrease in capacity for hosting Li. The second process is that the $Mn^{2+}$ can migrate through the electrolyte to the negative electrode, and deposit on the negative electrode surface. It is speculated that the deposition of $Mn^{2+}$ ion occurs either as Mn oxide on the negative electrode, especially on graphite-containing negative electrodes, where it potentially may block lithium ion ($Li^+$) transport leading to decreased ion conductivity, or that the manganese forms metallic Mn clusters, which can potentially lead to continuous decomposition of the electrolyte. In certain aspects, the inventive technology may be used in electrochemical cells employing an active material comprising a transition metal that suffer from capacity fade or other performance loss over time and while advantageous for use with active materials comprising manganese, in alternative aspects, the inventive technology may also be useful for active materials comprising other transition metals, such nickel and cobalt.

Therefore, in various aspects, the positive electrode comprises an active material having a transition metal, which may be selected from the group consisting of: manganese, nickel, cobalt, and combinations thereof. In certain variations, the transition metal is manganese (Mn) and the electroactive material is selected from the group consisting of: lithium manganese oxide ($Li_{(1+x)}Mn_{(2-x)}O_4$), where $0 \leq x \leq 1$, lithium manganese nickel oxide ($LiMn_{(2-x)}Ni_xO_4$), where $0 \leq x \leq 1$, lithium nickel manganese cobalt oxide ($Li(Ni_xMn_yCo_z)O_2$), where $0 \leq x \leq 1$, $0 \leq y \leq 1$, $0 \leq z \leq 1$, and $x+y+z=1$, and combinations thereof. As discussed above, the present technology is particularly advantageous for use with lithium manganese oxide based positive electrode active materials, such as spinel $LiMn_2O_4$, $LiMn_{0.33}Ni_{0.33}Co_{0.33}O_2$, $LiMn_{0.5}Ni_{0.5}O_4$, and other Li-rich lithium manganese oxide material. Regardless of the mechanism, it is desirable to prevent deposition of transition metals, like manganese, on electrode materials, which otherwise has the potential to accelerate the electrolyte decomposition and detrimentally impact the solid electrolyte interphase (SEI) layer, as will be discussed in greater detail below.

In various aspects, the negative electrode 22 includes an electroactive material as a lithium host material capable of functioning as a negative terminal of a lithium-ion battery. The negative electrode 22 may thus include the electroactive lithium host material and optionally another electrically conductive material, as well as one or more polymeric binder materials to structurally hold the lithium host material together. For example, in one embodiment, the negative electrode 22 may include an active material comprising graphite, silicon, tin, or other negative electrode particles intermingled with a material selected from the group consisting of: polyvinylidene difluoride (PVDF), a nitrile butadiene rubber (NBR), carboxymethoxyl cellulose (CMC), and combinations thereof, by way of non-limiting example. Graphite is often used to form the negative electrode 22 because it exhibits advantageous lithium intercalation and deintercalation characteristics, is relatively non-reactive in the electrochemical cell environment, and can store lithium in quantities that provide a relatively high energy density. Commercial forms of graphite and other graphene materials that may be used to fabricate the negative electrode 22 are available from, by way of non-limiting example, Timcal Graphite and Carbon of Bodio, Switzerland, Lonza Group of Basel, Switzerland, or Superior Graphite of Chicago, United States of America. Other materials can also be used to form the negative electrode 22, including, for example, lithium-silicon and silicon containing binary and ternary alloys and/or tin-containing alloys, such as Si—Sn, SiSnFe, SiSnAl, SiFeCo, $SnO_2$, and the like. In certain alternative embodiments, lithium-titanium anode materials are contemplated, such as $Li_{4+x}Ti_5O_{12}$, where $0 \leq x \leq 3$, including lithium titanate ($Li_4Ti_5O_{12}$) (LTO). The present technology is particularly suitable for use with negative electroactive materials for the negative electrode 22 that are selected from the group consisting of: graphite, silicon, silicon-containing alloys, tin-containing alloys, and combinations thereof. Notably, the present technology is particularly suitable for use with negative electrode materials for the negative electrode 22 that comprise graphite materials. Such graphite materials may of course be combined with other electroactive materials. The principles of the present teachings may likewise be advantageous for use with other negative electrode materials, such as those containing silicon or tin, in certain alternative variations. The negative electrode current collector 32 may be formed from copper or any other appropriate electrically conductive material known to those of skill in the art.

Figure 2:
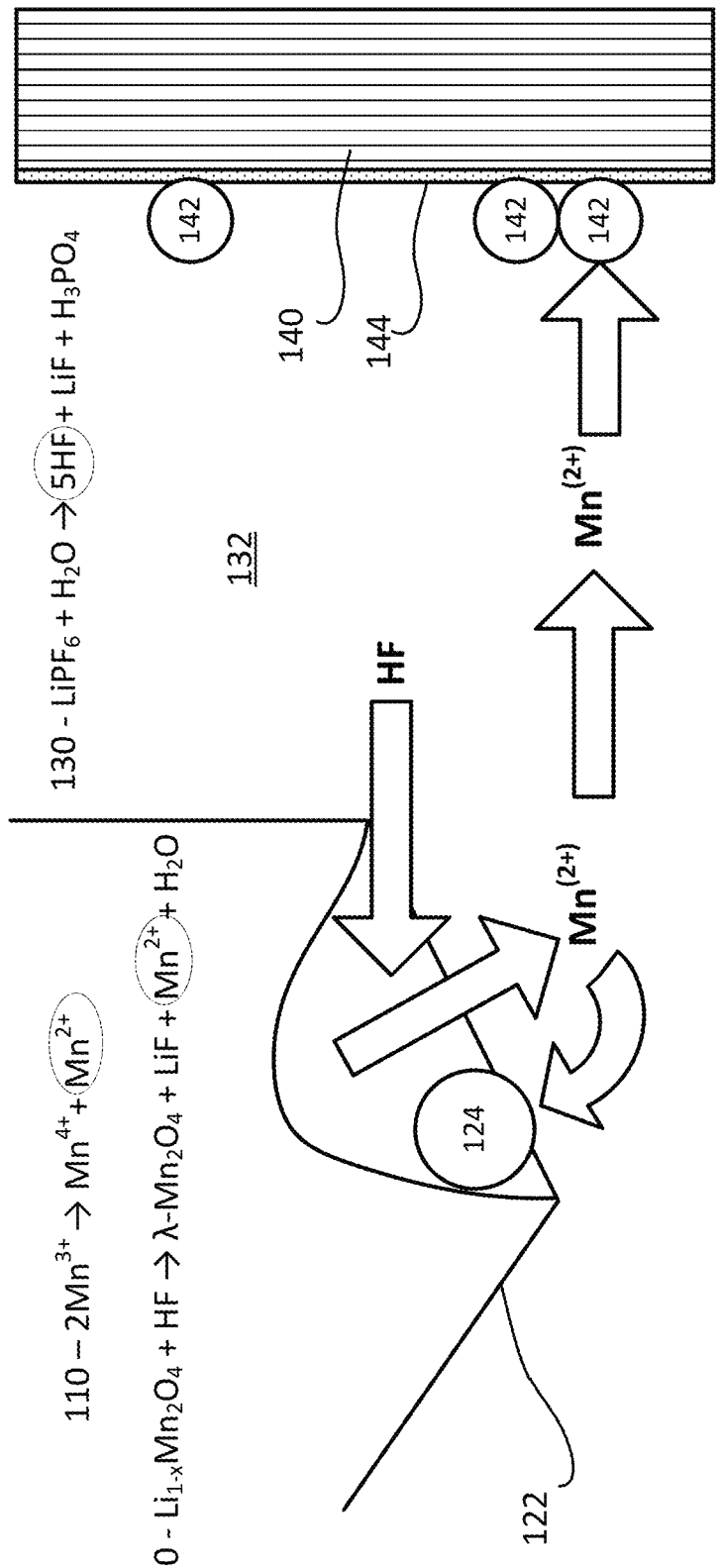
FIG. 2 is an exemplary schematic showing a theorized mechanism of manganese disproportion, re-precipitation, and deposition at a positive electrode having an active material comprising lithium manganese oxide electroactive materials in a lithium-ion electrochemical cell.

As discussed above, manganese (Mn) dissolution has been considered as one of the main issues responsible for the capacity fading in lithium manganese oxide-based positive electrode materials. While not limiting the present teachings to any particular theory, it is theorized manganese (Mn) dissolution and deposition may occur in a conventional lithium-ion battery cell as shown via the theorized mechanisms in FIG. 2, which are described in J. Vetter et al., "Ageing mechanisms in lithium-ion batteries," J. Power Sources, Vol. 147, Nos. 1-2, pp. 269-281 (Sep. 9, 2005), incorporated herein by reference in its entirety. A positive electrode 122 comprises an exemplary lithium manganese oxide material (lithium manganese spinel, $LiMn_2O_4$) electroactive material. Manganese ions may be formed from the electroactive material by the reaction $LiMn_2O_4 \rightarrow [Li_xMn_{2-x}]O_4 + Mn^{2+}$, where $0 < x < 1$. At low potentials, a disproportionation reaction may generate manganese ions by the reaction designated 110, where $2Mn^{3+} \rightarrow Mn^{4+} + Mn^{2+}$. Furthermore, an electrolyte 132 may comprise fluorine compounds, such as $LiPF_6$, which may potentially degrade as shown in reaction 130, where $LiPF_6$ reacts with water to form hydrofluoric acid (HF) in addition to lithium fluoride and phosphoric acid. The hydrofluoric acid may migrate near or within the positive electrode 122. As such, reaction 120 may occur where acid dissolution of $Li_{1-x}Mn_2O_4$ may occur, where $Li_{1-x}Mn_2O_4 + HF \rightarrow \lambda - MnO_2 + LiF + Mn^{2+} + H_2O$. Thus, reactions 110 and 120 each potentially generate $Mn^{2+}$ ions. During operation of the electrochemical cell, the $Mn^{2+}$ ions may re-precipitate within or at the positive electrode 122 as different species shown as 124, including $Mn_xO_y$, $MnF_2$, $MnCO_3$, and the like. Alternatively, the $Mn^{2+}$ ions may migrate through the electrolyte 132 (and through a separator, not shown in FIG. 2) to the negative electrode 140. At the negative electrode 140, the manganese metal 142 may deposit on a surface via a reduction reaction, for example.

When the manganese is deposited on the negative electrode 140, it may damage the solid electrolyte interface layer 144 and block lithium ion intercalation into the negative electrode 140. Further, the degradation of the positive electrode electroactive material potentially results in material loss and capacity fading. Thus, in accordance with certain aspects of the present teachings, it is believed that a main mechanism for the capacity fading in manganese-containing materials can be attributed to Mn deposited on negative electrodes that comprise graphite or other negative electrode materials, which catalyzes electrolyte decomposition.

Figure 3:
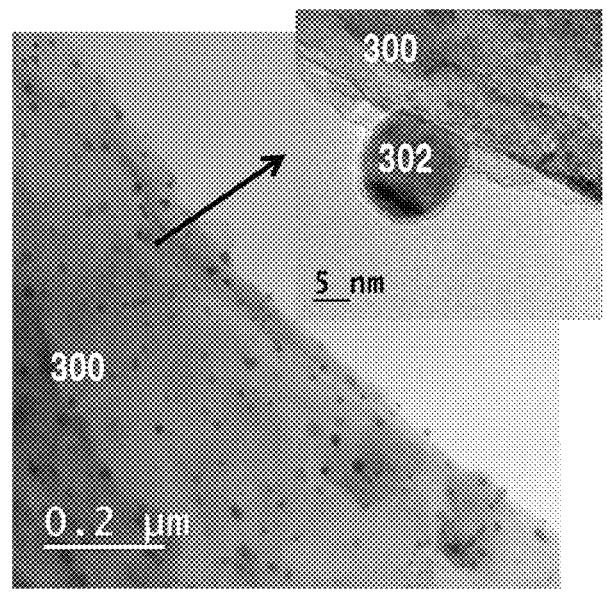
FIG. 3 shows a scanning electron microscopy (SEM) image of a negative electrode in a lithium-ion battery formed of graphite having a plurality of manganese nanoparticles deposited on a surface thereof (scale is 0.2 µm). The inset shows a detailed view of the region of the surface indicated by the arrow (scale is 5 nm)
Figure 4:
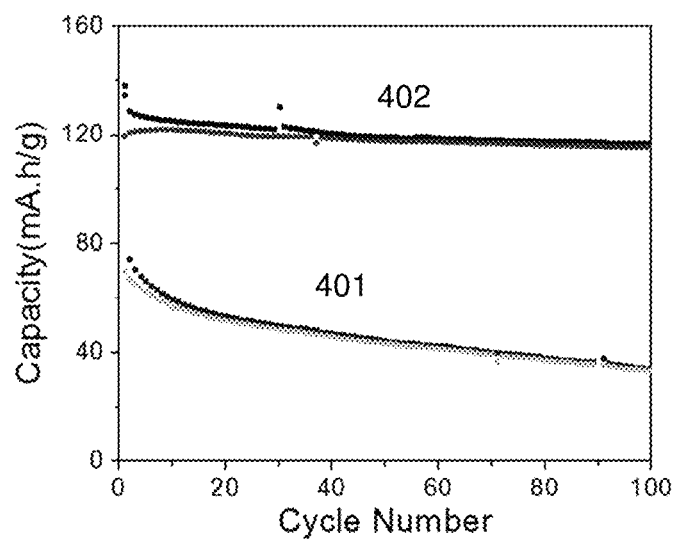
FIG. 4 shows specific capacity of a lithium-ion battery having a lithium manganese spinel positive electrode active material for both a full cell and a half cell over 100 cycles of charging and discharging of the cells.

FIG. 3 shows a scanning electron microscopy (SEM) image of a negative electrode 300 formed of graphite material in a lithium-ion battery. The graphite negative electrode 300 has regions of manganese 302 deposited on a surface thereof (shown at a scale of 0.2 μm). A detailed region of the surface of the graphite electrode material 300 surface can be seen in the inset of FIG. 3 (shown at 5 nm), which shows regions or nanoparticles of manganese 302 deposited thereon. FIG. 4 shows specific capacity for 100 charge/discharge cycles in a lithium-ion battery by using lithium manganese spinel positive electrode active materials for both a full cell 401 and a half cell 402. As can be seen in FIG. 4, while the capacity only diminishes slightly for the half cell 402 over 100 cycles (less than approximately 10 mA·h/g), the cell capacity diminishes or fades significantly (over approximately 35 mA·h/g) in 100 cycles for the full electrochemical cell 401, which includes both positive and negative electrodes. The diminished capacity or capacity fade that occurs in a full cell 401 employing a positive electrode active material comprising manganese is believed to be due to at least one of the mechanisms outlined above, where manganese deposits on the negative electrode. Thus, minimizing deposition and formation of manganese on the surface of electrodes within an electrochemical cell, especially negative electrodes, in accordance with certain aspects of the present disclosure, diminishes capacity fade and improves the life of lithium-ion batteries employing manganese-containing electroactive materials.

Notably, in alternative embodiments, the present disclosure likewise provides the ability to minimize or prevent deposition of other transition metals (aside from manganese) on electrodes within an electrochemical cell and is not necessarily limited to manganese-containing systems alone. Such transition metals may include: silver (Ag), gold (Au), cadmium (Cd), cobalt (Co), chromium (Cr), copper (Cu), iron (Fe), hafnium (Hf), mercury (Hg), iridium (Ir), molybdenum (Mo), niobium (Nb), nickel (Ni), osmium (Os), palladium (Pd), platinum (Pt), rhodium (Rh), ruthenium (Ru), technetium (Tc), titanium (Ti), tungsten (W), vanadium (V), zinc (Zn), and zirconium (Zr). In certain variations, the inventive technology is particularly suitable for use with a positive electroactive material comprising a transition metal selected from the group consisting of: manganese (Mn), nickel (Ni), cobalt (Co), and combinations thereof. In certain embodiments, the positive electroactive material comprises manganese (Mn) as a transition metal. While the present teachings are primarily directed to manganese-containing oxide positive electroactive materials and graphite-based negative electroactive material systems, the principles of using surface coatings to suppress or minimize deposition of metals on electrodes, especially negative electrodes, may be used in conjunction with any other electroactive materials that undesirably deposit or accumulate on electrode or other surfaces within an electrochemical cell or battery.

Thus, in accordance with various aspects of the present teachings, an electrode material in an electrochemical cell comprises an ultrathin surface coating that reduces or eliminates deposition of manganese or other transition metals. In various aspects, the surface coating is a thin layer applied to one or more preselected surface regions of the electrode material. The thin surface coating provides sufficient coverage of the exposed surface regions to minimize deposition, adsorption and/or reaction of metal on the electrode surface in the battery cell, while minimizing electrical impedance at the electroactive material surface. In certain aspects, the electrode is a negative electrode having an active material selected from the group consisting of: graphite, silicon, silicon-containing alloys, tin-containing alloys, and combinations thereof. In certain preferred aspects, a surface of a negative electrode material comprises graphite for use in an electrochemical cell having an ultrathin surface coating that reduces or eliminates deposition of manganese or other transition metals thereon. In certain variations, a thickness of the surface coating on the electrode, such as the graphite-containing negative electrode, is an ultrathin coating of less than or equal to about 40 nm, optionally less than or equal to about 35 nm, optionally less than or equal to about 30 nm, optionally less than or equal to about 25 nm, optionally less than or equal to about 20 nm, optionally less than or equal to about 15 nm, optionally less than or equal to about 10 nm, optionally less than or equal to about 9 nm, optionally less than or equal to about 8 nm, optionally less than or equal to about 7 nm, optionally less than or equal to about 6 nm, optionally less than or equal to about 5 nm, optionally less than or equal to about 4 nm, optionally less than or equal to about 3 nm, optionally less than or equal to about 2 nm, optionally less than or equal to about 1 nm, optionally less than or equal to about 0.75 nm, and in certain variations optionally less than or equal to about 0.5 nm. In certain variations, an ultrathin coating is less than or equal to the depth of two to three atomic monolayers. In the case of a coating formed of aluminum oxide molecules, a few atomic layers of aluminum oxide ($Al_2O_3$) forms a coating having a thickness of about 0.55 nm.

In certain variations, a thickness of the ultrathin surface coating may be greater than or equal to about 0.5 nm to less than or equal to about 15 nm, optionally greater than or equal to about 1 nm to less than or equal to about 10 nm, and in certain variations, optionally greater than or equal to about 1 nm to less than or equal to about 6 nm.

In certain aspects, the present disclosure provides a method for making an electroactive material for an electrochemical cell that comprises applying a surface coating to an electroactive or electrode material. In certain variations, the electrode material comprises a negative electrode active material selected from the group consisting of: graphite, silicon, silicon-containing alloys, tin-containing alloys, and combinations thereof. In certain variations, the electrode material comprises graphite for a negative electrode. The surface coating formed by such a process has a thickness of less than or equal to about 40 nm and optionally less than or equal to about 20 nm in certain aspects. The surface coating may be an electronically insulating coating. Further, the surface coating may be capable of minimizing or preventing deposition of transition metals on the electrode. The transition metal is optionally selected from the group consisting of: manganese (Mn), nickel (Ni), cobalt (Co), and combinations thereof. The surface coating is especially well-suited to minimizing or preventing deposition of manganese on negative electrodes comprising graphite. In certain variations, the process for applying the surface coating may be atomic layer deposition (ALD), chemical vapor infiltration, chemical vapor deposition, physical vapor deposition, wet chemistry, and/or sol gel techniques with any of the precursors and conditions described herein.

Thus, in accordance with certain aspects of the present disclosure, a material for an electrochemical cell electrode is provided, which may comprise graphite, silicon, silicon-containing alloys, tin-containing alloys, and combinations thereof. The electrode has a surface coating applied thereto to minimize or prevent deposition of transition metals, such as manganese, on the electrode. The surface coating may be applied to any region of a surface of the electrode material (e.g., graphite) that may be exposed to electrolyte or solvent within the electrochemical cell to minimize deposition, adsorption, or reaction of metallic species, as will be discussed in greater detail below. In certain variations, the surface coating is an oxide-based surface coating, which is applied with precursors to form an oxide-containing coating. In certain embodiments, the oxide-based surface coating is selected from the group consisting of: aluminum oxide ($Al_2O_3$), titanium oxide ($TiO_2$), vanadium oxide ($V_2O_5$), and silicon oxide ($SiO_2$). Such oxide-based surface coatings may be formed by using one or more precursors for aluminum oxide ($Al_2O_3$), titanium oxide ($TiO_2$), vanadium oxide ($V_2O_5$), and/or silicon oxide ($SiO_2$) materials. In certain other embodiments, the oxide-based surface coating comprises a material aluminum oxide ($Al_2O_3$). Such an oxide-based surface coating may be formed by using one or more precursors for an aluminum oxide ($Al_2O_3$) coating.

In certain alternative variations, a surface coating on the electrode material or electrode material particles that minimizes or prevents deposition of transition metals on the electrode comprises a fluoride-based coating or a nitride-based coating. By fluoride-based coating, it is meant that the coating is applied with precursors to form a fluoride-containing coating. In certain embodiments, the fluoride-based coating may comprise lithium fluoride (LiF) or aluminum fluoride ($AlF_3$), by way of example. Such a concept similarly applies to nitride-based coatings, which may likewise contain oxygen-containing species. In certain embodiments, the nitride-based coating may comprise aluminum nitride (AlN).

In various aspects, such a surface coating is applied to an electrode material by a deposition process. In certain aspects, the surface coating may be applied by an atomic layer deposition (ALD) process that can coat the electrode material, such as graphite, with a conformal layer that comprises the oxide-based layer, such as aluminum oxide ($Al_2O_3$). ALD is a self-limiting process for chemical deposition or growth of ultrathin films on a substrate. ALD typically involves subjecting the target substrate to self-saturating surface reactions. The surface reactions may be conducted sequentially and/or in an alternating fashion, depending on the composition and structure of the film desired.

ALD is typically conducted in an apparatus having a vacuum deposition chamber with a holder for the substrate, at least one vapor source (known as the precursor) and various controls by which the substrate may be individually subjected to the vapor source. Such controls may include heaters, coolers, flow routing and valves, for controlling the amount of exposure of the substrate to the vapor source. The regions of the electrode material to be coated may be pre-treated, for example, by plasma treatment. The ALD process for deposition of surface coating onto regions of the electrode material involves reaction of the surface in a deposition chamber with a single vapor of precursor materials or reaction of the surface with multiple vapors introduced sequentially and having the precursors of the surface coating. Suitable precursors may include organic and inorganic metallic compounds, such as trimethylaluminum (TMA). The vapor may be pulsed into the vacuum deposition chamber on a carrier gas and may be quickly purged, for example, by vacuum pumping or flushing with an inert gas. Such pulsing of the vapor and purging of the system may be performed to control the dose of the precursor vapor to which the substrate is exposed.

Generally, the ALD process is performed at elevated temperatures and reduced pressures. Temperature of the deposition chamber is desirably high enough that reaction between the substrate and the precursors in the vapor occurs, while also preventing condensation of the vapor onto the surface. As non-limiting examples, the reaction space in the deposition chamber may be heated to between about 150° C. and about 600° C., and the operating pressure may be between about $7.5 \times 10^{-2}$ Torr and about 4 Torr (about 1 Pa to about 5000 Pa).

As a result of ALD process and surface reactions, a single atomic layer of the surface coating material is bound to the electrode surface, thereby providing a monoatomic coating. With sequential or alternating reactions, composite layers may be formed. Furthermore, additional atomic monolayers may be grown over the monoatomic layer, thereby forming a surface coating having greater thicknesses.

Figure 5:
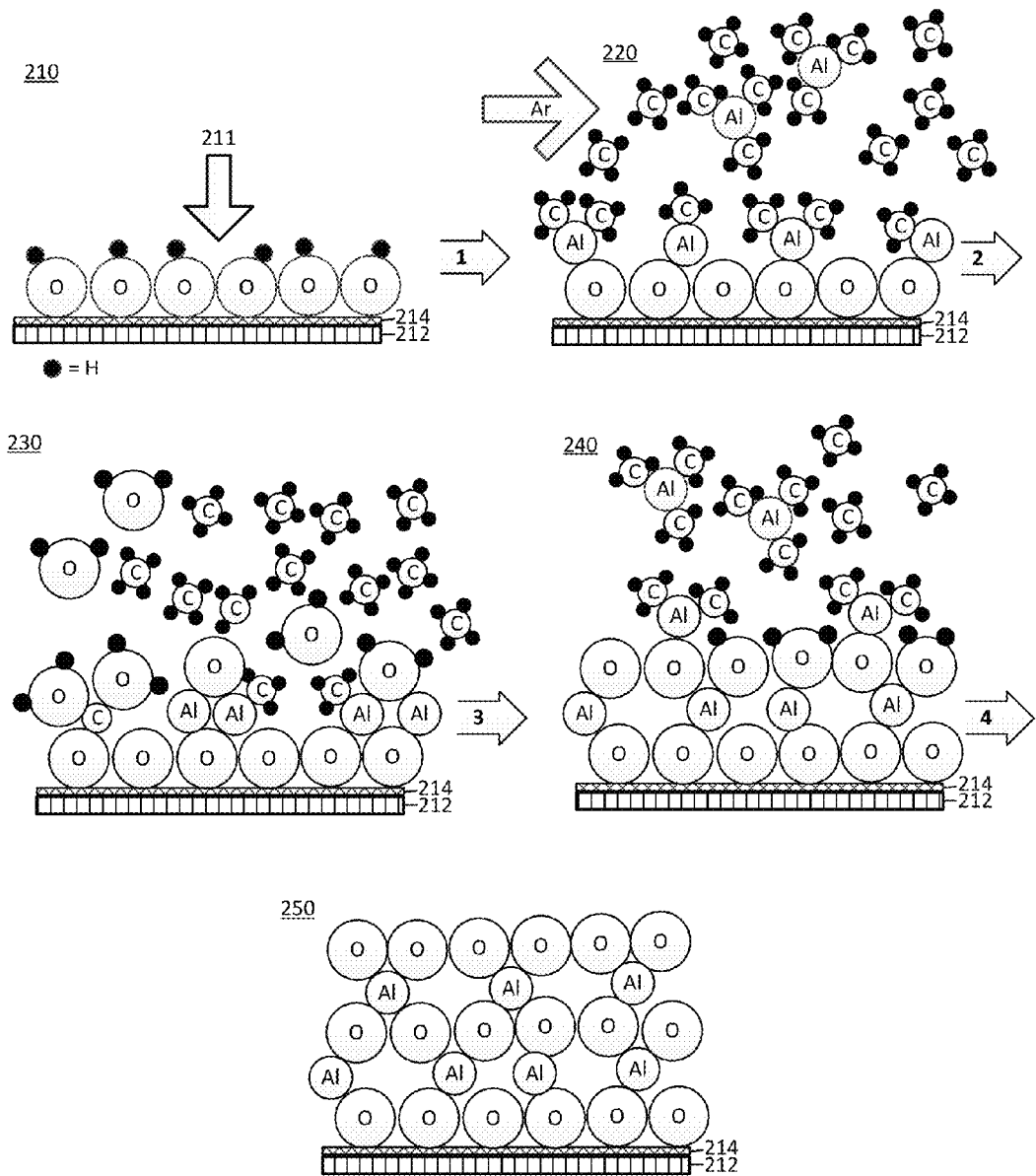
FIG. 5 illustrates formation of aluminum oxide ($Al_2O_3$) coatings on a graphite-based electrode material by an atomic layer deposition (ALD) process.

The ALD process can be illustrated by the formation of aluminum oxide ($Al_2O_3$) coatings on a graphite-based electrode material as in the illustrative process shown in FIG. 5. At step 210, an electrode material substrate 212 comprising graphite has a surface 214 that is first pretreated with oxygen plasma 211 or peroxide ($H_2O_2$) to form a plurality of hydroxyl groups (OH) on the surface. The presence of the hydroxide groups on surfaces of the electrode material substrate 212 provides suitable reactive species for the deposition of aluminum-containing species on preselected regions of the surface 214. The hydroxide groups may be protected in an argon atmosphere and excess plasma 211 or peroxide may be removed by a flow of argon gas. The electrode material substrate 212 may then be placed in a suitable reaction chamber (not shown) to conduct a step-wise conformal coating process.

As shown in step 220, argon is introduced to the ALD chamber. A predetermined amount of aluminum, in the form of a suitable volatile precursor compound, such as trimethyl aluminum (TMA (($CH_3)_3Al$)), is introduced as a vapor (for example at a temperature of about 50° C.) and flows into contact with the exposed surfaces 214 of the electrode material substrate 212. Preferably, a stoichiometric excess of TMA to hydroxyl or reactive groups on the surface 214 is provided. The TMA chemisorbs to the oxygen/hydroxyl groups on the surface 214 of the electrode material substrate 212. Methane ($CH_4$) is released as a byproduct. Typically, reaction of the aluminum-containing material with the surface groups of electrode material substrate 212 is completed in a short time frame, on the order of a few seconds, for example.

Next, in step 230 water vapor ($H_2O$) is introduced into the reaction chamber to flow over the exposed surface 214 of electrode material substrate 212. The water ($H_2O$) further reacts with the TMA and forms methane ($CH_4$). As such, a first conformal layer of aluminum oxide ($Al_2O_3$) forms on the surface 214 of the electrode material substrate 212. Excess reactants and byproducts may be removed from the chamber. In step 240, TMA is introduced again to the chamber to form another layer of aluminum oxide. The ALD process in steps 220-240 are repeated to grow an $Al_2O_3$ film layer by layer on the surface 214 of the electrode material substrate 212. As generally shown in step 250, two atomic monolayers of $Al_2O_3$ are formed.

The ALD process is illustrative of one technique for forming aluminum oxide ($Al_2O_3$) coatings on a graphite-based electrode material, but the process may also be used to form other coatings as well, by way of non-limiting example. For example, other oxide-based, nitride-based, or fluoride-based coatings may be formed on the graphite-based electrode materials via an ALD process. In certain aspects, the oxide-based coating may be selected from aluminum oxide ($Al_2O_3$), titanium oxide ($TiO_2$), silicon oxide ($SiO_2$), vanadium oxide ($VnO_5$), zirconium oxide ($ZrO_2$), or zinc oxide (ZnO). For a titanium oxide coating ($TiO_2$), the precursor materials may be tetrakis(diethylamido)titanium(IV), tetrakis(dimethylamido)titanium(IV), and/or titanium(IV) isopropoxide, by way of example. For a vanadium oxide coating ($V_2O_5$), the metal precursor can be vanadium(V) oxytriisopropoxide, for example. For a zirconium oxide coating ($ZrO_2$), the precursors may be zirconium tetrachloride ($ZrCl_4$) and oxygen ($O_2$). For a zinc oxide coating (ZnO), the precursor material may be methylzinc isopropoxide. For a silicon oxide coating, the precursor materials can be silicon tetrachloride, tetraethyl orthosilicate, and/or tris(tert-butoxy)silanol, by way of example. For a fluoride-based coating, suitable precursor materials can be lithium fluoride (LiF), aluminum fluoride ($AlF_3$), and the like. For a nitride-based coating, suitable precursor materials can be ammonia ($NH_3$), ammonium hydroxide ($NH_4OH$), titanium nitride (TiN), vanadium nitride (VN), aluminum nitride ((AlN) where the precursor is TMA and ammonia), and tungsten hexafluoride ($WF_6$), silicon tetrachloride ($SiCl_4$), or dichlorosilane ($SiH_2Cl_2$) combined with ammonia ($NH_3$), and the like.

In certain variations, the applying of the surface coating can be conducted by an atomic layer deposition (ALD) process with a precursor selected from the group consisting of: trimethyl aluminum (TMA (($CH_3)_3Al$)), tetrakis(diethylamido)titanium(IV), tetrakis(dimethylamido)titanium(IV), titanium(IV) isopropoxide, vanadium(V) oxytriisopropoxide, silicon tetrachloride, tetraethyl orthosilicate, tris(tert-butoxy) silanol, lithium fluoride (LiF), aluminum fluoride ($AlF_3$), ammonia ($NH_3$), ammonium hydroxide ($NH_4OH$), titanium nitride (TiN), vanadium nitride (VN), aluminum nitride ((AlN) where the precursor is TMA and ammonia), tungsten hexafluoride ($WF_6$) and ammonia ($NH_3$), silicon tetrachloride ($SiCl_4$) and ammonia ($NH_3$), or dichlorosilane ($SiH_2Cl_2$) combined with ammonia ($NH_3$), lithium fluoride (LiF), aluminum fluoride ($AlF_3$), and the like. Moreover, in alternative variations, $Al_2O_3$ or other coatings can be easily obtained by using different precursors and deposition processes.

In certain other alternative variations, an oxide-based surface coating can be synthesized on the electrode material (e.g., material comprising graphite) by wet chemistry or sol gel processes, physical vapor deposition (PVD), chemical vapor deposition (CVD), chemical vapor infiltration, and other known conventional processes to apply such coatings to solid materials. For example, in a PVD process, such as magnetron sputtering, aluminum metal can be used as target, with a gas comprising argon and oxygen ($Ar:O_2$) used to sputter and deposit an $Al_2O_3$ coating on the pre-fabricated graphite electrode or alternatively graphite particles. In a thermal or CVD process, TMA at temperatures above 400° C. for thermal CVD and above about 200° C. can be used for plasma CVD deposition on the pre-fabricated graphite electrode or alternatively graphite particles, by way of example. Thus, applying the surface coating may comprise a deposition process including one or more coating precursor species to form an oxide-based surface coating, such as $Al_2O_3$, $TiO_2$, $SiO_2$, $VnO_5$, $ZrO_2$, or ZnO, by using a process selected from the group consisting of: ALD, CVD, PVD and wet chemistry.

Other deposition processes may include applying one or more coating precursor species to form a nitride-based surface coating, such as AlN, TiN, VN, $Si_3N_4$, WN, TiN (sputtering Ti target with $N_2$, or CVD with titanium tetrachloride and $NH_3$ as precursors) or by replacing water with ammonia ($NH_3$) or ammonium oxide ($NH_4OH$) with precursors used for forming oxide-based coatings, by way of example. In one embodiment, atomic layer deposition (ALD) can use a precursor comprising ammonia ($NH_3$) to form an aluminum nitride (AlN) coating on the negative electrode material. Similarly, a fluoride-based surface coating may be formed on the electrode material by using one or more precursor species: $AlF_3$, LiF, $NiF_2$, $CaF_2$, $TiF_4$, $TiF_2$, $MgF_2$, $WF_6$ and/or active metallic fluorides (having a heating temperature above 160° C.) or by replacing water with titanium (IV) fluoride ($TiF_4$) or titanium (II) fluoride ($TiF_2$) with precursors for forming oxide-based coatings, by way of example.

In certain aspects, the present disclosure provides a surface coating formed on an electrode material, such as a negative electrode graphite material, that is formed from a precursor material selected from the group consisting of: trimethyl aluminum (($CH_3)_3Al$), lithium fluoride (LiF), aluminum fluoride ($AlF_3$), tetrakis(diethylamido)titanium(IV), tetrakis(dimethylamido)titanium(IV), titanium(IV) isopropoxide, vanadium(V) oxytriisopropoxide, zirconium tetrachloride ($ZrCl_4$), methylzinc isopropoxide, silicon tetrachloride, tetraethyl orthosilicate, tris(tert-butoxy)silanol, ammonia ($NH_3$), ammonium hydroxide ($NH_4OH$), titanium nitride (TiN), vanadium nitride (VN), tungsten hexafluoride ($WF_6$), silicon tetrachloride ($SiCl_4$), dichlorosilane ($SiH_2Cl_2$), and combinations thereof.

In certain variations, the applying of the surface coating can be conducted by an atomic layer deposition (ALD) process with a precursor selected from the group consisting of: trimethyl aluminum (TMA (($CH_3)_3Al$)), tetrakis(diethylamido)titanium(IV), tetrakis(dimethylamido)titanium(IV), titanium(IV) isopropoxide, vanadium(V) oxytriisopropoxide, silicon tetrachloride, tetraethyl orthosilicate, tris(tert-butoxy) silanol, lithium fluoride (LiF), aluminum fluoride ($AlF_3$), ammonia ($NH_3$), ammonium hydroxide ($NH_4OH$), titanium nitride (TiN), vanadium nitride (VN), aluminum nitride ((AlN) where the precursor is TMA and ammonia), tungsten hexafluoride ($WF_6$) and ammonia ($NH_3$), silicon tetrachloride ($SiCl_4$) and ammonia ($NH_3$), or dichlorosilane ($SiH_2Cl_2$) combined with ammonia ($NH_3$), and combinations thereof. In certain preferred variations, the surface coating is an oxide-based surface coating applied with a precursor material for a coating comprising trimethyl aluminum (($CH_3)_3Al$) to form $Al_2O_3$.

Negative electrodes may comprise greater than or equal to about 50% to less than or equal to about 90% of an electroactive material (e.g., graphite particles), optionally greater than or equal to about 5% to less than or equal to about 30% of an electrically conductive material, and a balance binder. Suitable electroactive materials are those discussed previously above and may be the same as the electrically conductive materials, such as graphite, or may be selected from carbon black, powdered nickel, metal particles, conductive polymers, and combinations thereof. Useful binders may comprise a polymeric material and extractable plasticizer suitable for forming a bound porous composite, such as halogenated hydrocarbon polymers (such as poly(vinylidene chloride) and poly((dichloro-1,4-phenylene)ethylene), fluorinated urethanes, fluorinated epoxides, fluorinated acrylics, copolymers of halogenated hydrocarbon polymers, epoxides, ethylene propylene diamine termonomer (EPDM), ethylene propylene diamine termonomer (EPDM), polyvinylidene difluoride (PVDF), hexafluoropropylene (HFP), ethylene acrylic acid copolymer (EAA), ethylene vinyl acetate copolymer (EVA), EAA/EVA copolymers, PVDF/HFP copolymers, and mixtures thereof.

An electrode may be made by mixing the electrode active material, such as graphite powder or particles, into a slurry with a polymeric binder compound, a non-aqueous solvent, optionally a plasticizer, and optionally if necessary, electrically conductive particles. The slurry can be mixed or agitated, and then thinly applied to a substrate via a doctor blade. The substrate can be a removable substrate or alternatively a functional substrate, such as a current collector (such as a metallic grid or mesh layer) attached to one side of the electrode film. In one variation, heat or radiation can be applied to evaporate the solvent from the electrode film, leaving a solid residue. The electrode film may be further consolidated, where heat and pressure are applied to the film to sinter and calendar it. In other variations, the film may be air-dried at moderate temperature to form self-supporting films. If the substrate is removable, then it is removed from the electrode film that is then further laminated to a current collector. With either type of substrate it may be necessary to extract or remove the remaining plasticizer prior to incorporation into the battery cell.

In certain preferred variations, pre-fabricated electrodes formed of graphite via the active material slurry casting described above can be directly coated via a coating formation process, such as in atomic layer deposition (ALD), or physical vapor deposition, or chemical vapor infiltration. Thus, one or more exposed regions of the pre-fabricated negative electrodes comprising the graphite can be coated to minimize or prevent deposition of transition metals, such as manganese, on the surfaces of negative electrode materials (like graphite) when incorporated into the electrochemical cell. In other variations, a plurality of particles comprising an electroactive material, like graphite, can be coated with an oxide-based surface coating. Then, the coated particles can be used in the active material slurry to form the negative electrode, as described above.

A battery may thus be assembled in a laminated cell structure, comprising an anode layer, a cathode layer, and electrolyte/separator between the anode and cathode layers. The anode and cathode layers each comprise a current collector. A negative anode current collector may be a copper collector foil, which may be in the form of an open mesh grid or a thin film. The current collector can be connected to an external current collector tab.

For example, in certain variations, an electrode membrane, such as an anode membrane, comprises the electrode active material (e.g., graphite) dispersed in a polymeric binder matrix over a current collector. The separator can then be positioned over the negative electrode element, which is covered with a positive electrode membrane comprising a composition of a finely divided lithium insertion compound in a polymeric binder matrix. A positive current collector, such as aluminum collector foil or grid completes the assembly. Tabs of the current collector elements form respective terminals for the battery. A protective bagging material covers the cell and prevents infiltration of air and moisture. Into this bag, an electrolyte is injected into the separator (and may also be imbibed into the positive and/or negative electrodes) suitable for lithium ion transport. In certain aspects, the laminated battery is further hermetically sealed prior to use.

Thus, in certain variations, the present disclosure provides an electroactive material, which may be used in an electrochemical cell, such as a lithium-ion battery. A negative electrode material may comprise graphite, silicon, silicon alloys, tin, and their composites, for example. In certain variations, the negative electrode material comprises graphite. The electrode material has a surface coating formed thereon, which may have a thickness of less than or equal to about 20 nm that suppresses deposition of transition metals onto the negative electrode within the electrochemical cell. In certain variations, the graphite material is contained in a pre-fabricated electrode layer and the surface coating is applied to at least one surface of the pre-fabricated electrode layer. In other variations, the surface coating is applied to a plurality of graphite particles, which can then subsequently be incorporated into the electrode. In certain preferred aspects, the surface coating is an oxide-based coating, but in alternative variations, may also be a fluoride-based or a nitride-based surface coating. In certain variations, the surface coating is an oxide-based surface coating comprising aluminum oxide ($Al_2O_3$) formed from a precursor material comprising trimethyl aluminum (($CH_3)_3Al$). In certain other variations, the surface coating is a nitride-based coating comprising aluminum nitride (AlN) formed from a precursor material comprising ammonia ($NH_3$). In preferred aspects, the surface coating is ultrathin and formed in an atomic layer deposition process.

In certain aspects, it is preferred that an electroactive material having a surface coating for minimizing or preventing deposition of transition metals on a surface of the negative electrode (e.g., comprising graphite) in an electrochemical cell, such as a lithium-ion battery, prevents or permits only minimal amounts of transition metal deposition during the life of the electrochemical cell. In certain aspects, the surface coating is capable of minimizing or preventing deposition of transition metals on a surface of an electrode to less than or equal to about 5% of surface area of the exposed surface of the electrode, optionally less than or equal to about 4%, optionally less than or equal to about 3%, optionally less than or equal to about 2%, optionally less than or equal to about 1%, optionally less than or equal to about 0.5%, and in certain aspects, less than or equal to about 0.25% of surface area of the exposed surface of the electrode that would otherwise be deposited on a comparative electrode material lacking the surface coating.

In certain aspects, an electrochemical cell or lithium-ion battery comprising an electroactive material having a surface coating according to certain variations of the present disclosure is substantially free of deposited transition metals through the life of the electrochemical cell or battery. "Substantially free" is intended to mean that the compound is absent to the extent that it cannot be detected, or that if the compound is present, it does not cause undue detrimental impact and/or prevent the overall use of the battery for its intended purpose.

In various aspects, a lithium-ion electrochemical cell incorporating an inventive electroactive material having an electrode material with a surface coating having a thickness of less than or equal to about 40 nm, optionally less than or equal to about 20 nm, minimizes or prevents deposition of the transition metal on the negative electrode to substantially prevent the decomposition of electrolyte and therefore maintain charge capacity of the lithium-ion electrochemical cell. In certain aspects, a lithium-ion electrochemical cell incorporating an inventive electroactive material having an electrode material with a surface coating for minimizing or preventing deposition of transition metals has a rate capacity of greater than or equal to about 0.05 Coulombs (C/20) up to about 20 Coulombs, where the lithium-ion electrochemical cell has good capacity retention (at least 80 capacity retention after 100 cycles).

In certain variations, a lithium-ion battery incorporating an inventive electroactive material having a surface coating for minimizing or preventing deposition of transition metals on a surface of the negative electrode substantially maintains charge capacity (e.g., performs within a preselected range or other targeted high capacity use) for at least 500 hours of battery operation, optionally greater than or equal to about 1,000 hours of battery operation, optionally greater than or equal to about 1,500 hours of battery operation, and in certain aspects, greater than or equal to about 2,000 hours or longer of battery operation (active cycling). In certain variations, the lithium-ion battery incorporating an inventive electroactive/ electrode material having a surface coating maintains charge capacity and thus is capable of operating within 20% of target charge capacity for a duration of greater than or equal to about 2 years (including storage at ambient conditions and active cycling time), optionally greater than or equal to about 3 years, optionally greater than or equal to about 4 years, optionally greater than or equal to about 5 years, optionally greater than or equal to about 6 years, optionally greater than or equal to about 7 years, optionally greater than or equal to about 8 years, optionally greater than or equal to about 9 years, and in certain aspects, optionally greater than or equal to about 10 years. In other variations, the lithium-ion battery incorporating an inventive electrode material having a surface coating is capable of operating at less than or equal to about 30% change in a preselected target charge capacity (thus having a minimal charge capacity fade), optionally at less than or equal to about 20%, optionally at less than or equal to about 15%, optionally at less than or equal to about 10%, and in certain variations optionally at less than or equal to about 5% change in charge capacity for a duration of at least about 100 deep discharge cycles, optionally at least about 200 deep discharge cycles, optionally at least about 500 deep discharge cycles, optionally at least about 1,000 deep discharge cycles.

Stated in another way, in certain aspects, a lithium-ion battery or electrochemical cell incorporating the inventive electroactive material having a surface coating for minimizing or preventing deposition of transition metals on a surface of the negative electrode substantially maintains charge capacity and is capable of operation for at least about 1,000 deep discharge cycles, optionally greater than or equal to about 2,000 deep discharge cycles, optionally greater than or equal to about 3,000 deep discharge cycles, optionally greater than or equal to about 4,000 deep discharge cycles, and in certain variations, optionally greater than or equal to about 5,000 deep discharge cycles.

In certain variations, an electrode material for an electrochemical cell is thus provided having a coating formed on one or more surface regions of a graphite material. The coating has a thickness of less than or equal to about 40 nm to minimize or prevent deposition of transition metals onto the graphite material within the electrochemical cell. The minimizing or preventing of deposition of transition metals onto the graphite material is capable of improving electrochemical cell performance according to any of the criteria listed above, including substantially maintaining charge capacity and thus minimizing capacity loss.

In other variations, the present disclosure contemplates a lithium-ion electrochemical cell comprising a negative electrode having a coating formed on one or more surface regions at a thickness of less than or equal to about 40 nm. The negative electrode material may comprise a negative electroactive material selected from the group consisting of: graphite, silicon, silicon-containing alloys, tin-containing alloys, and combinations thereof. In certain aspects, the negative electroactive material comprises graphite. The lithium-ion electrochemical cell also comprises a positive electrode comprising a positive electroactive material comprising a transition metal; a separator; and an electrolyte. The coating minimizes or prevents deposition of the transition metal on the negative electrode to substantially maintain charge capacity of the lithium-ion electrochemical cell for greater than or equal to about 500 hours of operation.

In yet other aspects, methods for making an electrode for an electrochemical cell are provided. In certain aspects, the methods make a negative electrode. The method optionally comprises applying a surface coating via a deposition process to one or more surface regions of a negative electrode material selected from the group consisting of: graphite, silicon, silicon-containing alloys, tin-containing alloys, and combinations thereof. The surface coating formed by the applying process has a thickness of less than or equal to about 40 nm. In certain aspects, the coating is selected from the group consisting of: an oxide-based coating, a fluoride-based coating, and a nitride-based coating, and the applying process is selected from the group consisting of: atomic layer deposition (ALD), physical vapor deposition (PVD), chemical vapor deposition (CVD), chemical vapor infiltration, wet chemistry, and sol-gel. In certain variations, the coating is an oxide-based surface coating selected from the group consisting of: aluminum oxide ($Al_2O_3$), silicon dioxide ($SiO_2$), titanium oxide ($TiO_2$), zirconium oxide ($ZrO_2$), and zinc oxide (ZnO). In yet other aspects, the applying process is atomic layer deposition (ALD) that uses a trimethyl aluminum (($CH_3)_3Al$) precursor to form an aluminum oxide ($Al_2O_3$) coating on the negative electrode material or alternatively may be an ALD process that uses ammonia ($NH_3$) as a precursor to form an aluminum nitride (AlN) coating on the negative electrode material. In certain aspects, the negative electrode material is contained in a pre-fabricated electrode layer and the surface coating is applied to at least one surface of the pre-fabricated electrode layer. In yet other aspects, the negative electrode material comprises a plurality of particles, so that the surface coating is applied to the plurality of particles that subsequently form the electrode.

In other aspects, the present disclosure provides methods of minimizing or preventing deposition of transition metals on electrodes in a lithium-ion battery is contemplated. The method optionally comprises applying a surface coating to an electrode material that may optionally comprise graphite. The surface coating is selected from the group consisting of: an oxide-based surface coating, a fluoride-based surface coating, and a nitride-based surface coating. The electrode material is used in a negative electrode in a lithium-ion battery that further comprises a positive electrode comprising an electroactive material comprising a transition metal, a separator, and an electrolyte. The surface coating minimizes or prevents deposition of the transition metal onto the electrode material to substantially maintain charge capacity during charging and discharging of the lithium-ion battery for greater than or equal to about 1,000 cycles.

In certain variations, the applying process is atomic layer deposition (ALD) that uses a precursor selected from the group consisting of: titanium (II) fluoride ($TiF_2$), titanium (IV) fluoride ($TiF_4$), magnesium fluoride ($MgF_2$), and combinations thereof, to form an aluminum fluoride ($AlF_3$) coating on the electrode material. The coating may be an oxide-based surface coating selected from the group consisting of: aluminum oxide ($Al_2O_3$), silicon dioxide ($SiO_2$), titanium oxide ($TiO_2$), zirconium oxide ($ZrO_2$), and zinc oxide (ZnO). The surface coating optionally comprises aluminum oxide ($Al_2O_3$) that is applied via an atomic layer deposition (ALD) process using a trimethyl aluminum (($CH_3)_3Al$) precursor. Alternatively, the surface coating may be applied in an atomic layer deposition (ALD) process that uses ammonia ($NH_3$) as a precursor to form an aluminum nitride (AlN) coating on the electrode material.

In certain other aspects, the present disclosure provides an electroactive material for an electrochemical cell comprising an oxide-based surface coating formed on graphite. In certain aspects, the oxide-based surface coating has a thickness of less than or equal to about 15 nm that minimizes or suppresses substantially all deposition of transition metals to maintain integrity of the electrolyte within the electrochemical cell for at least 3 years of electrochemical cell use.

In certain other aspects, the present disclosure provides an electroactive material for an electrochemical cell comprising a fluoride-based surface coating formed on graphite. The fluoride-based surface coating has a thickness of less than or equal to about 15 nm that minimizes or suppresses substantially all deposition of transition metals to maintain integrity of the electrolyte within the electrochemical cell for at least 3 years of electrochemical cell use.

In certain other aspects, the present disclosure provides an electroactive material for an electrochemical cell comprising a nitride-based surface coating formed on graphite. The nitride-based surface coating has a thickness of less than or equal to about 15 nm that minimizes or suppresses substantially all deposition of transition metals to maintain integrity of the electrolyte within the electrochemical cell for at least 3 years of electrochemical cell use.

EXAMPLES

Example 1

For electrochemical tests, $LiMn_{1.5}Ni_{0.5}O_4$ and natural graphite are used as positive and negative electrodes, respectively. $LiMn_{1.5}Ni_{0.5}O_4$ is synthesized by solid state reaction of $Li_2CO_3$ (commercially obtained from Fisher), $NiCO_3$ (commercially obtained from Alfa Aesar), and $MnCO_3$ (commercially obtained from Alfa Aesar) precursors. The mixed precursors are heated at 500° C. for 12 hours, at 650° C. for 12 hours, and at 900° C. for 6 hours in air with intermediate grinding and pelletizing. Natural graphite is purchased from Sigma-Aldrich, USA. The current collectors, including Cu and Al foils for negative and positive electrodes respectively, are obtained from Pred Materials. Both positive and negative electrodes are fabricated using the doctor blade method. The slurry contains 80 wt. % active materials (either $LiMn_{1.5}Ni_{0.5}O_4$ or natural graphite), 10 wt. % carbon black (Super P, Alfa-Aesar, USA), and 10 wt. % polyvinylidene fluoride (PVDF, Alfa-Aesar, USA). 1-Methyl-2-pyrrolidinone (NMP, Alfa-Aesar, USA) is used as the solvent and the as-made electrodes are dried at 180° C. in a vacuum oven overnight.

Figure 6:
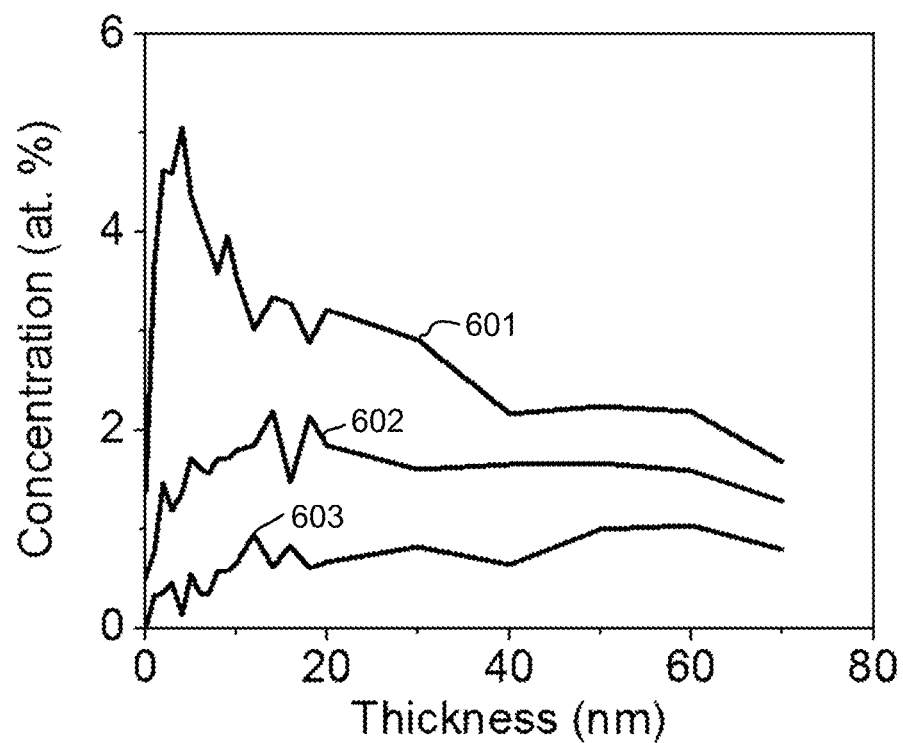
FIG. 6 shows an X-Ray photon spectroscopy (XPS) depth profile taken on a conventional uncoated electrode, as compared to a surface coated positive electrode surface and a surface coated negative electrode surface according to certain aspects of the present disclosure.

The electrode materials as formed are coated with aluminum oxide ($Al_2O_3$) applied via a typical atomic layer deposition aqueous process. The $Al_2O_3$ layer is deposited on both $LiMn_{1.5}Ni_{0.5}O_4$ positive and natural graphite negative electrodes at 180° C. with a trimethylaluminum (TMA, deposition grade, Sigma-Aldrich, USA) and high performance liquid chromatography grade $H_2O$ (Sigma-Aldrich, USA) as the precursors. A typical reaction for forming the coating is $2Al(CH_3)_3+3H_2O \rightarrow Al_2O_3+6CH_4$. An $Al_2O_3$ layer having a thickness of about 0.11 nm is deposited in each cycle on electrode surfaces (half inch in diameter). An x-ray photon spectroscopy (XPS) depth profile is taken on the coated positive electrode surface (shown as 602 in FIG. 6) and the negative electrode surface (shown as 601 in FIG. 6).

Comparative Example 2

A conventional working negative electrode comprising graphite particles is formed by forming a slurry with about 80 wt. % natural graphite, about 10 wt. % carbon black (Super P, Alfa-Aesar, USA), and 10 wt. % polyvinylidene fluoride (PVDF, Alfa-Aesar, USA). 1-Methyl-2-pyrrolidinone (NMP, Alfa-Aesar, USA) is used as the solvent. The slurry is processed via the doctor blade method on a copper foil in the same manner as described in Example 1. An XPS depth profile is taken on the uncoated graphite surface of the negative working electrode (shown as 601 in FIG. 6) and shown in comparison to the positive 602 and negative 603 electrodes from Example 1 in FIG. 6. As can be seen, the uncoated negative electrode 601 of Comparative Example 2 has the greatest atomic % of graphite.

Example 3

Both half and full cells are assembled in order to investigate the effect of surface coating on Mn dissolution. Microporous tri-layered polypropylene (PP) and polyethylene (PE) polymer membrane (Celgard, USA) and 1 M $LiPF_6$ in a mixed solution of ethylene carbonate and diethyl carbonate (1:1 volume ratio, Novolyte, USA) are selected as the separator and electrolyte for the full cell, respectively. An aluminum oxide surface-coated positive electrode and the aluminum oxide surface-coated negative electrode prepared as described above in Example 1 are cut and incorporated as necessary into the half cell or full cell. An uncoated portion of the electrode is connected to an external tab. The electrolyte and separator are disposed between the coated surfaces of respective positive and negative electrodes to form a full-cell battery.

Electrochemical measurements are performed with the constant current density of 10 $mAg^{-1}$ (about C/10) based on the mass of the positive electrode in the working voltage window of 3 V to about 4.8 V for full cells. A cycle test of the battery is performed. Charge discharge cycles are repeated 100 times at ambient conditions.

Figure 7:
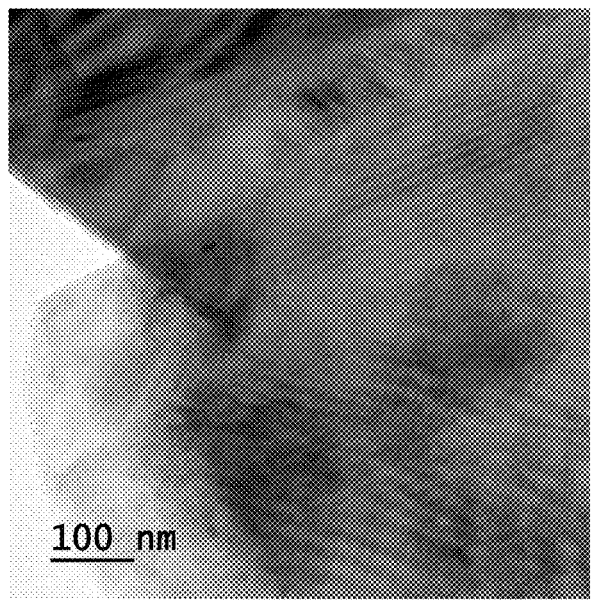
FIG. 7 is an image of an aluminum oxide coated surface of a graphite negative electrode free of deposited manganese in accordance with certain aspects of the present disclosure taken via high resolution transmission electron microscopy (HRTEM) (scale is 100 nm)

After cycle testing, the negative electrode is removed. An image of the aluminum oxide coated surface of the graphite negative electrode is taken via high resolution transmission electron microscopy (HRTEM), as shown in FIG. 7 (having a scale of 100 nm). As can be observed, after 100 cycles, no manganese nanoparticles have formed on the surface. By way of comparison, an uncoated negative electrode comprising graphite as used in a comparative electrochemical cell shown in FIG. 3 has manganese nanoparticles 302 deposited on the surface 300 thereof. While not limiting the inventive technology to any particular theory, the oxide-based surface coating may react with active sites on the graphite surface of the negative electrode, which could otherwise serve as nucleation sites for manganese particles. Furthermore, the oxide-based surface coating may also serve as an electric insulating layer at the negative electrode, thus blocking electron transfer for reducing the manganese ions to manganese metal ($Mn^{2+}+2e^-\rightarrow Mn$).

FIGS. 8 and 9 show comparative data for a battery full cell designated "1" having a negative electrode coated with aluminum oxide having a thickness of 5 nm deposited as described above in the context of Example 1. $Al_2O_3$ coatings are applied to surfaces of both negative electrodes and positive electrodes using the atomic layer deposition (ALD) technique described above in the context of Example 1 to improve capacity retention of the lithium-ion electrochemical cell. Spinel $LiMn_{1.5}Ni_{0.5}O_4$ is selected as the positive electrode active material, because it has the potential for 5 V lithium ion batteries (e.g., high power). It also has cycling stability and reasonable capacity (a theoretical capacity of 148 mA·h/g).

Another full cell designated "2" has a coated positive electrode comprising a spinel $LiMn_{1.5}Ni_{0.5}O_4$ (positive electrode material) with the electrolyte described in Example 3 is coated with aluminum oxide, as described above. Another full cell designated "3" is similar to the cell of "1," but has a thinner aluminum oxide coating on the graphite negative electrode, where the coating is at about 0.5 nm thickness. Lastly, a full cell designated "4" is provided for comparative purposes, where both the negative and positive electrodes are uncoated. The other components are otherwise the same as in the battery cells described above.

FIG. 8 shows specific capacity of examples 1-4 over 100 cycles (conducted as described above in the context of Example 3), while FIG. 9 shows conversion efficiency (%). In FIGS. 8 and 9, cell "1" (having the thicker 5 nm aluminum oxide coating on the negative graphite electrode) has the best performance, as it loses the least amount of specific capacity and has the highest conversion efficiency. The next best cell performance is cell "3" having the thinner 0.5 nm aluminum oxide coating on the negative graphite electrode. The coated positive electrode battery in cell "2" has lower charge capacity and lower conversion efficiency than either of the coated negative electrodes in "1" and "3." The worst performance is observed for the uncoated negative and positive electrodes in "4."

In accordance with certain aspects of the present teachings, a surface coating on an electrode, especially a negative electrode, improves electrochemical cell capacity retention. Thus, the $Al_2O_3$ coating deposited on the graphite electrode materials suppresses Mn deposition on the electrode surface. Where the negative electrode comprises graphite, the $Al_2O_3$ coating appears to serve (1) to suppress the deposition of $Mn^{2+}$ on the surface, thus preventing any potential damage to the SEI layer which would be caused by the Mn deposition; (2) to mitigate the Mn-induced side reactions; and (3) to reduce or suppress excessive SEI formation on the graphite surface and therefore minimize the capacity loss related with the SEI layer. The positive electrode likewise may be coated to improve the positive electrode structural stability and/or to prevent or inhibit Mn dissolution into the electrolyte. However, as shown above in the context of FIGS. 8 and 9, a surface coating on a negative electrode was surprisingly found to work more efficiently for improving capacity retention than a surface coating disposed on a positive electrode.

While the $Al_2O_3$ coating on the positive electrode helps to suppress Mn dissolution, the $Al_2O_3$ coating on the negative electrode was counter-intuitively more helpful and efficient to prevent Mn deposition and thereby to achieve better capacity retention in lithium ion batteries. The $Al_2O_3$ coating on the graphite negative electrode appears to suppress or eliminate Mn deposition on its surface and this appears to be more efficient for improving battery capacity retention than applying the coating on the positive electrode. In this regard, minimizing or preventing deposition of transition metals, such as Mn, onto graphite slows electrolyte decomposition and prevents or avoids potential damage to the SEI layer, thus eventually improving current efficiency and overall life of lithium ion batteries. As such, while the surface coating may be applied to either the positive electrode and/or the negative electrode, in certain aspects, only the negative electrode need be coated to provide certain advantages associated with the inventive technology.

Electrode materials having a surface coating incorporated into electrochemical cells that employ an active material comprising a transition metal, such as manganese, serve to improve battery life and capacity and reduce potential failure of electrochemical cells. In accordance with certain aspects of the present disclosure, an ultrathin surface coating, which may have a thickness of a few atomic layers, such as an aluminum oxide ($Al_2O_3$) coating (for example, about 0.55 nm thickness), on the electrode surfaces can significantly mitigate the capacity fading. For example, an aluminum oxide coating is particularly advantageous to apply to a negative electrode surface comprising graphite to improve battery performance in electrochemical cells having a transition metal active material. As such, the inventive technology provides an elegantly simple and inexpensive process to mitigate the capacity fading associated with manganese and other transition metals dissolution issues observed in lithium-ion batteries using such active materials. As such, an electrode having an ultrathin surface coating according to various aspects of the present disclosure can significantly increase capacity retention and extend battery life.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electrode material for an electrochemical cell comprising:
a coating formed on exposed surface regions of a negative electrode comprising a material selected from the group consisting of: graphite, silicon, silicon-containing alloys, tin-containing alloys, and combinations thereof, wherein the coating has a thickness of less than or equal to about 40 nm to minimize or prevent deposition of transition metals so that less than or equal to about 5% of a surface area of the exposed surface regions of the negative electrode within the electrochemical cell has any transition metal deposited thereon.

2. The electrode material of claim 1, wherein the coating is selected from the group consisting of: an oxide-based coating, a fluoride-based coating, and a nitride-based coating.

3. The electrode material of claim 1, wherein the coating is an oxide-based surface coating selected from the group consisting of: aluminum oxide ($Al_2O_3$), silicon dioxide ($SiO_2$), titanium oxide ($TiO_2$), zirconium oxide ($ZrO_2$), and zinc oxide (ZnO).

4. The electrode material of claim 1, wherein the coating comprises aluminum oxide ($Al_2O_3$) and the negative electrode comprises graphite.

5. The electrode material of claim 1, wherein the thickness of the coating is greater than or equal to about 0.5 nm to less than or equal to about 15 nm.

6. A lithium-ion electrochemical cell comprising:
a negative electrode having a coating formed on exposed surface regions at a thickness of less than or equal to about 40 nm, wherein the negative electrode comprises a negative electroactive material selected from the group consisting of: graphite, silicon, silicon-containing alloys, tin-containing alloys, and combinations thereof;
a positive electrode comprising a positive electroactive material comprising a transition metal;
a separator; and
an electrolyte;
wherein the coating minimizes or prevents deposition of the transition metal on the negative electrode so that less than or equal to about 5% of a surface area of the exposed surface regions has any transition metal deposited thereon and the coating serves to maintain charge capacity within 20% of a target charge capacity of the lithium-ion electrochemical cell for greater than or equal to about 500 hours of operation.

7. The lithium-ion electrochemical cell of claim 6, wherein the coating is selected from the group consisting of: an oxide-based coating, a fluoride-based coating, and a nitride-based coating.

8. The lithium-ion electrochemical cell of claim 6, wherein the coating is an oxide-based coating having a thickness of less than or equal to about 20 nm.

9. The lithium-ion electrochemical cell of claim 6, wherein the coating comprises aluminum oxide ($Al_2O_3$) and the negative electroactive material comprises graphite.

10. The lithium-ion electrochemical cell of claim 6, wherein the coating is an oxide-based surface coating selected from the group consisting of: aluminum oxide ($Al_2O_3$), silicon dioxide ($SiO_2$), titanium oxide ($TiO_2$), zirconium oxide ($ZrO_2$), and zinc oxide (ZnO).

11. The lithium-ion electrochemical cell of claim 6, wherein the transition metal is selected from the group consisting of: manganese (Mn), nickel (Ni), cobalt (Co), and combinations thereof.

12. The lithium-ion electrochemical cell of claim 6, wherein the transition metal is manganese (Mn) and the positive electroactive material is selected from the group consisting of: lithium manganese oxide ($Li_{(1+x)}Mn_{(2-x)}O_4$), where $0 \leq x \leq 1$, lithium manganese nickel oxide ($LiMn_{(2-x)}Ni_xO_4$), where $0 \leq x \leq 1$, lithium nickel manganese cobalt oxide ($Li(Ni_xMn_yCo_z)O_2$), where $0 \leq x \leq 1$, $0 \leq y \leq 1$, $0 \leq z \leq 1$, and $x+y+z=1$, and combinations thereof.

13. A lithium-ion electrochemical cell comprising:
a pre-fabricated negative electrode comprising a negative electroactive material and a polymeric binder, wherein the negative electroactive material is selected from the group consisting of: graphite, silicon, silicon-containing alloys, tin-containing alloys, and combinations thereof;
a coating having a thickness of less than or equal to about 40 nm formed on exposed surface regions of the pre-fabricated negative electrode;
a positive electrode comprising a positive electroactive material comprising a transition metal;
a separator; and
an electrolyte; wherein the coating minimizes or prevents deposition of the transition metal on the pre-fabricated negative electrode so that less than or equal to about 5% of a surface area of the exposed surface regions has any transition metal deposited thereon and the coating serves to maintain charge capacity within 20% of a target charge capacity of the lithium-ion electrochemical cell for greater than or equal to about 500 hours of operation.

14. The electrode material of claim 1, wherein the coating on the exposed surface regions is a conformal coating.

15. The lithium-ion electrochemical cell of claim 6, wherein the coating on the exposed surface regions is a conformal coating.

* * * * *